United States Patent [19]

Suyama

[11] Patent Number: 5,596,261
[45] Date of Patent: Jan. 21, 1997

[54] CHARGE-STATUS DISPLAY SYSTEM FOR AN ELECTRIC VEHICLE

[75] Inventor: Kouichi Suyama, Wako, Japan

[73] Assignee: Honda Giken Kogyo Kabushiki Kaisha, Tokyo, Japan

[21] Appl. No.: 328,558

[22] Filed: Oct. 25, 1994

Related U.S. Application Data

[63] Continuation of Ser. No. 9,642, Jan. 27, 1993, abandoned.

[30] Foreign Application Priority Data

Jan. 29, 1992 [JP] Japan ................................. 4-014366

[51] Int. Cl.⁶ .......................... H02J 7/00; G01N 27/416; G08B 21/00
[52] U.S. Cl. ............................. 320/48; 324/426; 340/636
[58] Field of Search .............................. 320/43, 44, 48, 320/2; 340/636; 324/426, 434

[56] References Cited

U.S. PATENT DOCUMENTS

| 3,090,871 | 5/1963 | Gorman | 307/10 |
|---|---|---|---|
| 3,740,636 | 6/1973 | Hogrefe et al. | 320/48 |
| 3,940,679 | 2/1976 | Brandwein et al. | 320/48 |
| 4,217,645 | 8/1980 | Barry et al. | 320/48 X |
| 4,236,594 | 12/1980 | Ramsperger | 180/167 |
| 4,250,976 | 2/1981 | Mochida | 180/271 |
| 4,289,836 | 9/1981 | Lemelson | 429/61 |
| 4,671,111 | 6/1987 | Lemelson | 340/52 R |
| 4,673,921 | 6/1987 | Saito et al. | 340/539 |
| 4,820,966 | 4/1989 | Fridman | 320/43 X |
| 4,890,108 | 12/1989 | Drori et al. | 341/176 |
| 5,008,647 | 4/1991 | Brunt et al. | 340/432 |
| 5,111,127 | 5/1992 | Johnson | 320/2 |
| 5,206,097 | 4/1993 | Burns et al. | 320/48 X |
| 5,254,996 | 10/1993 | Claar et al. | 341/176 |
| 5,352,982 | 10/1994 | Nakazawa et al. | 324/427 |

FOREIGN PATENT DOCUMENTS 191801  12/1988  Japan.

Primary Examiner—Robert Nappi
Assistant Examiner—Patrick B. Law
Attorney, Agent, or Firm—Lyon & Lyon

[57] ABSTRACT

A charge-status display system which is suitable for use with an electric vehicle. In the charge-status display system, a plurality of detecting means detect the conditions of charging of the electric vehicle, and a determining means determines the results of that detection by the plurality of detecting means. A wireless transmitting means transmits the results of the detection and the results of the determination. Then, a receiving means in a portable remote unit receives therein the results of the detection and the results of the determination, which are transmitted from the transmitting means, and a display means displays the received information thereon. Thus, a charging operator can obtain information about the status of charging of the electric vehicle while at a location remote from the electric vehicle.

18 Claims, 21 Drawing Sheets

FIG.15A

| RESIDUAL CAPACITY<br>STATUS CODE | 0% | 10 | 20 | 30 | 40 | 50 | 60 | 70 | 80 | 90 | 100 |
|---|---|---|---|---|---|---|---|---|---|---|---|
| OFF | A0 | A1 | A2 | A3 | A4 | A5 | A6 | A7 | A8 | A9 | A10 |
| COMPLETION | B0 | B1 | B2 | B3 | B4 | B5 | B6 | B7 | B8 | B9 | B10 |
| ON CHARGE | C0 | C1 | C2 | C3 | C4 | C5 | C6 | C7 | C8 | C9 | C10 |
| STOP | D0 | D1 | D2 | D3 | D4 | D5 | D6 | D7 | D8 | D9 | D10 |

RESIDUAL CAPACITY(%)

FIG.15B

| A/C ROOM STATUS FLAG | PRE-A/C CONTROL FLAG | |
|---|---|---|
| | 「0」 | 「1」 |
| 「0」 | $E_0$ | $E_1$ |
| 「1」 | $F_0$ | $F_1$ |

FIG.15C

| α / β | $A_0$ | $A_1$ | ... | $A_{10}$ | $B_0$ | $B_1$ | ... | $B_{10}$ | $C_0$ | $C_1$ | ... | $C_{10}$ | $D_0$ | $D_1$ | ... | $D_{10}$ |
|---|---|---|---|---|---|---|---|---|---|---|---|---|---|---|---|---|
| $E_0$ | $\gamma_{a0}$ | $\gamma_{a1}$ | ... | $\gamma_{a10}$ | $\gamma_{a11}$ | $\gamma_{a12}$ | ... | $\gamma_{a21}$ | $\gamma_{a22}$ | $\gamma_{a23}$ | ... | $\gamma_{a32}$ | $\gamma_{a33}$ | $\gamma_{a34}$ | ... | $\gamma_{a43}$ |
| $E_1$ | $\gamma_{b0}$ | $\gamma_{b1}$ | ... | $\gamma_{b10}$ | $\gamma_{b11}$ | $\gamma_{b12}$ | ... | $\gamma_{b21}$ | $\gamma_{b22}$ | $\gamma_{b23}$ | ... | $\gamma_{b32}$ | $\gamma_{b33}$ | $\gamma_{b34}$ | ... | $\gamma_{b43}$ |
| $F_0$ | $\gamma_{c0}$ | $\gamma_{c1}$ | ... | $\gamma_{c10}$ | $\gamma_{c11}$ | $\gamma_{c12}$ | ... | $\gamma_{c21}$ | $\gamma_{c22}$ | $\gamma_{c23}$ | ... | $\gamma_{c32}$ | $\gamma_{c33}$ | $\gamma_{c34}$ | ... | $\gamma_{c43}$ |
| $F_1$ | $\gamma_{d0}$ | $\gamma_{d1}$ | ... | $\gamma_{d10}$ | $\gamma_{d11}$ | $\gamma_{d12}$ | ... | $\gamma_{d21}$ | $\gamma_{d22}$ | $\gamma_{d23}$ | ... | $\gamma_{d32}$ | $\gamma_{d33}$ | $\gamma_{d34}$ | ... | $\gamma_{d43}$ |

CHARGE-STATUS DISPLAY SYSTEM FOR AN ELECTRIC VEHICLE

This application is a continuation application of application Ser. No. 08/009,642, filed on Jan. 27, 1993, now abandoned.

FIELD OF THE INVENTION

The present invention relates to a charge-status display system suitable for use with an electric vehicle, which system is capable of monitoring the status of charging of the electric vehicle being charged and the status of the electric vehicle at a location remote from the electric vehicle.

DESCRIPTION OF THE RELATED ART

A battery, which serves as a running drive source of an electric vehicle, is charged in a user's garage or the like during the night. In this connection, a technical idea that the state of charging of the battery is displayed on an upper panel of a dash board, has been disclosed in Japanese Utility Model Application Laid-Open Publication No. 63-191801.

The time required to charge the electric vehicle is normally between seven and ten hours. Therefore, a charging operator leaves his/her electric vehicle when the charging of the battery is initiated. However, the charging operator cannot detect for example, a situation in which the charging of the battery is disrupted due to the disconnection of a charge cable, an increase in the concentration of hydrogen gas in a battery accommodating box or a situation in which the charging of the battery has been completed.

Therefore, the charging operator should often proceed to the garage or the like to confirm the conditions of the electric vehicle being charged, thus inconveniencing the charging operator.

SUMMARY OF THE INVENTION

With the foregoing problem in view, it is an object of the present invention to provide a portable display system suitable for use in an electric vehicle, which is capable of monitoring the status of charging of an electric vehicle and the status of the electric vehicle in detail at a location remote from the electric vehicle being charged.

According to a first aspect of the present invention, for achieving the above object, there is provided a charge-status display system suitable for use with an electric vehicle, for receiving therein and displaying thereon information indicative of the status of charging of a main battery used as a running drive source at a location remote from the electric vehicle, the information being transmitted from the electric vehicle, with the system comprising: the a charge-status detection unit disposed in the electric vehicle, said detection unit comprising a plurality of detecting means for detecting a plurality of operating conditions of the main battery, determining means for determining a status of charging of said main battery based on the results of detection by the plurality of detecting means and outputting signals representing said status of charging, and wireless transmitting means disposed in said electric vehicle for digitally coding said signals and for transmitting the same via wireless transmission and a display unit separated from said electric vehicle and disposed at a location remote from said electric vehicle, said display unit comprising, power supply means independent of said main battery for supplying power to said display unit, receiving means for receiving said signals transmitted by said wireless transmitting means and display means for displaying thereon said status of charging of said main battery based on said results of detection and said signals received by the receiving means.

The present invention also provides such a charge-status display system wherein the detecting means can include voltage and/or current detecting means for detecting a charging voltage and/or a charging current of said main battery, the determining means can include voltage and/or current determining means for determining whether said charging voltage and/or said charging current falls within a predetermined range, and the display unit can include display means for displaying thereon the result of the determination by said voltage and/or current determining means.

The present invention further provides such a charge-status display system wherein the detecting means can include a rotation sensor for detecting the rotation of each wheel.

The present invention still further provides such a charge-status display system wherein the detecting means can include leakage detecting means for detecting an undesired flow of electricity through a running-drive electric system and a control electric system, the determining means can include leakage determining means for determining whether the amount of said undesired flow of electricity falls within a predetermined range, and the display unit can include display means for displaying the result of the determination by said leakage determining means thereon.

The present invention still further provides such a charge-status display system wherein the detecting means can include connection detecting means for detecting the state of connection or non-connection between a power drive unit and said main battery, and the display unit can include display means for displaying the result of the detection by said connection detecting means thereon.

The present invention still further provides such a charge-status display system wherein the detecting means can include temperature detecting means for detecting the temperature of said main battery, the determining means can include temperature determining means for determining whether the temperature of said main battery is less than or more than a first predetermined value and less than or more than a second predetermined value, and the display unit can include display means for displaying thereon charge-stop information when it is determined that the temperature of said main battery is more than said second predetermined value and for displaying thereon on-charge information when it is determined that the temperature of said main battery is less than said second predetermined value.

The present invention still further provides such a charge-status display system wherein the detecting means can include hydrogen-gas concentration detecting means for detecting the concentration of hydrogen gas in a box for accommodating said main battery therein, the determining means can include hydrogen-gas concentration determining means for determining whether the concentration of the hydrogen gas is less than or more than a first predetermined value and less than or more than a second predetermined value, and the display unit can include display means for displaying power-reception stop information thereon when it is determined that the concentration of the hydrogen gas is more than said second predetermined value and for displaying on-charge information thereon when it is determined that the concentration of the hydrogen gas is less than said second predetermined value.

The present invention still further provides such a charge-status display system wherein the transmitting means can include timing-pulse generating means for intermittently transmitting information.

The present invention still further provides such a charge-status display system wherein the determining means can include self-diagnosing means.

The present invention still further provides such a charge-status display system wherein the determining means can determine whether the charging of said main battery is being effected, stopped and completed and said display means can effect different displays for every said determination.

The present invention still further provides such a charge-status display system wherein the transmitting means can include converting means for converting data about the status of charging of said main battery and data about the remaining capacity of said main battery into digital form and coding means for setting up new transmission data obtained by combining said digitized charge-status data and said digitized battery residual-capacity data together in code form so as to be represented in compact form, and said receiving means can include decoding means for decoding said coded transmission data in accordance with predetermined stored decoding codes.

The present invention still further provides such a charge-status display system wherein the receiving means can include display continuation signal generating means for producing a display continuation signal used to continue the present display unless new information is received within a predetermined period of time.

The present invention still further provides such a charge-status display system wherein the transmitting means can include storing means for storing vehicle-specifying information therein in advance and controlling means for reading the vehicle-specifying information stored in said storing means and transmitting said read vehicle-specifying information together with transmission information including charge-status information and battery residual-capacity information and the like.

The present invention still further provides such a charge-status display system wherein the electric vehicle can include a power transmission terminal for charging said display unit, and said display unit can include a power reception terminal electrically connected with said power transmission terminal, said display unit being capable of being charged under the action of the electric vehicle by electrically connecting said power reception terminal and said power transmission terminal to each other.

According to a second aspect of the present invention, there is provided a charge-status detecting device suitable for use in an electric vehicle, which can comprise a plurality of detecting means for detecting the operating conditions of a main battery used as a running drive source of the electric vehicle, determining means for determining a status of charging of said main battery based on the results of detection by said plurality of detecting means and outputting signals representing said status of charging, and wireless transmitting means disposed in said electric vehicle for digitally coding said signals and for transmitting said signals via wireless transmission to a receiving means disposed at a location remote from said electric vehicle, said receiving means being powered by a power supply means independent of said main battery.

According to a third aspect of the present invention, there is provided a charge-status display device suitable for use in an electric vehicle, which can comprise receiving means for receiving from a wireless transmitting means disposed in an electric vehicle digitally coded signals representing a charge status of a main battery wherein said signals are transmitted via wireless transmission from said wireless transmission means, and displaying means for display means for displaying thereon said charge status of said main battery based on said results of detection and said signals received by said receiving means, and power supply means independent of said main battery for supplying power to said receiving means and said display means.

In the charge-status display system according to the present invention, which is suitable for use in the electric vehicle, the plurality of detecting means detect the conditions of charging of the electric vehicle, and the determining means determine the results of detection by the plurality of detecting means. The wireless transmitting means transmits the results of the detection and the results of the determination via wireless transmission. Then, the receiving means receives therein the results of the detection and the results of the determination, which, are transmitted from the wireless transmitting means, and the display means displays the received information thereon.

Thus, a charging operator can obtain information about the status of charging of the electric vehicle at a location remote from the electric vehicle.

The above and other objects, features and advantages of the present invention will become apparent from the following description and the appended claims, taken in conjunction with the accompanying drawings in which a preferred embodiment of the present invention is shown by way of illustrative example.

BRIEF DESCRIPTION OF THE DRAWINGS

FIGS. 15(a), 15(b) and 15(c) are maps illustrating data to be used in operating the system of this invention in connection with the sequential routine shown in FIG. 6;

DETAILED DESCRIPTION OF THE PREFERRED EMBODIMENT

A charge-status display system according to the present invention, which is suitable for use with an electric vehicle, will hereinafter be described in detail with reference to the accompanying drawings in which a preferred embodiment is shown by way of illustrative example.

Figure 1:
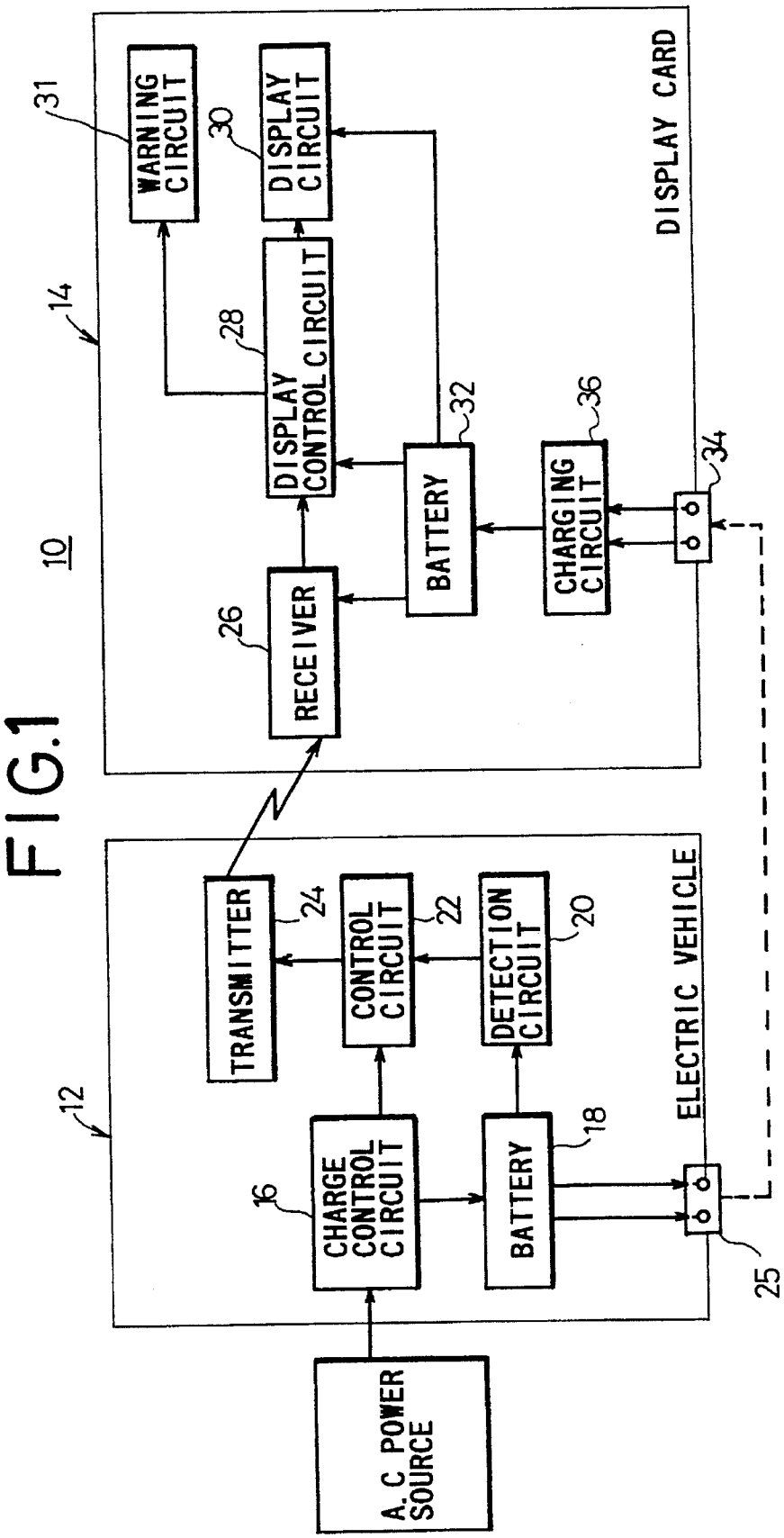
FIG. 1 is a schematic block diagram showing the functional relationships among the respective parts of a charge-status display system according to one embodiment of the present invention, which is suitable for use with an electric vehicle.

FIG. 1 is a block diagram showing the function of a charge-status display system 10 which embodies the present invention.

The charge-status display system 10 comprises an electric automobile or vehicle 12 and a portable display card 14 for displaying the state of charging of the electric vehicle 12.

The electric vehicle 12 includes a charge control circuit 16 for effecting charge control, a main battery 18 charged by electric power supplied from an external a.c. power source, a detection circuit 20 comprised of a plurality of kinds of sensors, a control circuit 22 for determining the conditions or state of the electric vehicle 12 while being under the charge, based on respective signals outputted from the detection circuit 20 and for determining the state of pre-air-conditioning (i.e. when air-conditioning is started before or "pre" use of the vehicle while still charging the main battery) of the electric vehicle 12, a wireless transmitter 24 for transmitting a signal indicative of the status of charging of the electric vehicle 12, which is outputted from the control circuit 22, and a power transmission terminal 25 for charging a battery of the display card 14 to be described later.

The display card 14 includes a receiver 26 for receiving therein the signal transmitted from the wireless transmitter 24, a display control circuit 28 for converting the received signal into displayable data, a display circuit 30 for displaying data outputted from the display control circuit 28, a warning circuit 31 for sounding a buzzer when various malfunctions or failures are developed, an independent battery 32 used as a power supply for the receiver 26, the display control circuit 28 and the display circuit 30 or the like, a power reception terminal 34 plugged or fitted into the power transmission terminal 25, a charging circuit 36 comprised of a DC/DC converter, for charging the battery 32 in response to the electric power supplied via the power reception terminal 34 from the power transmission terminal 25.

Figure 2:
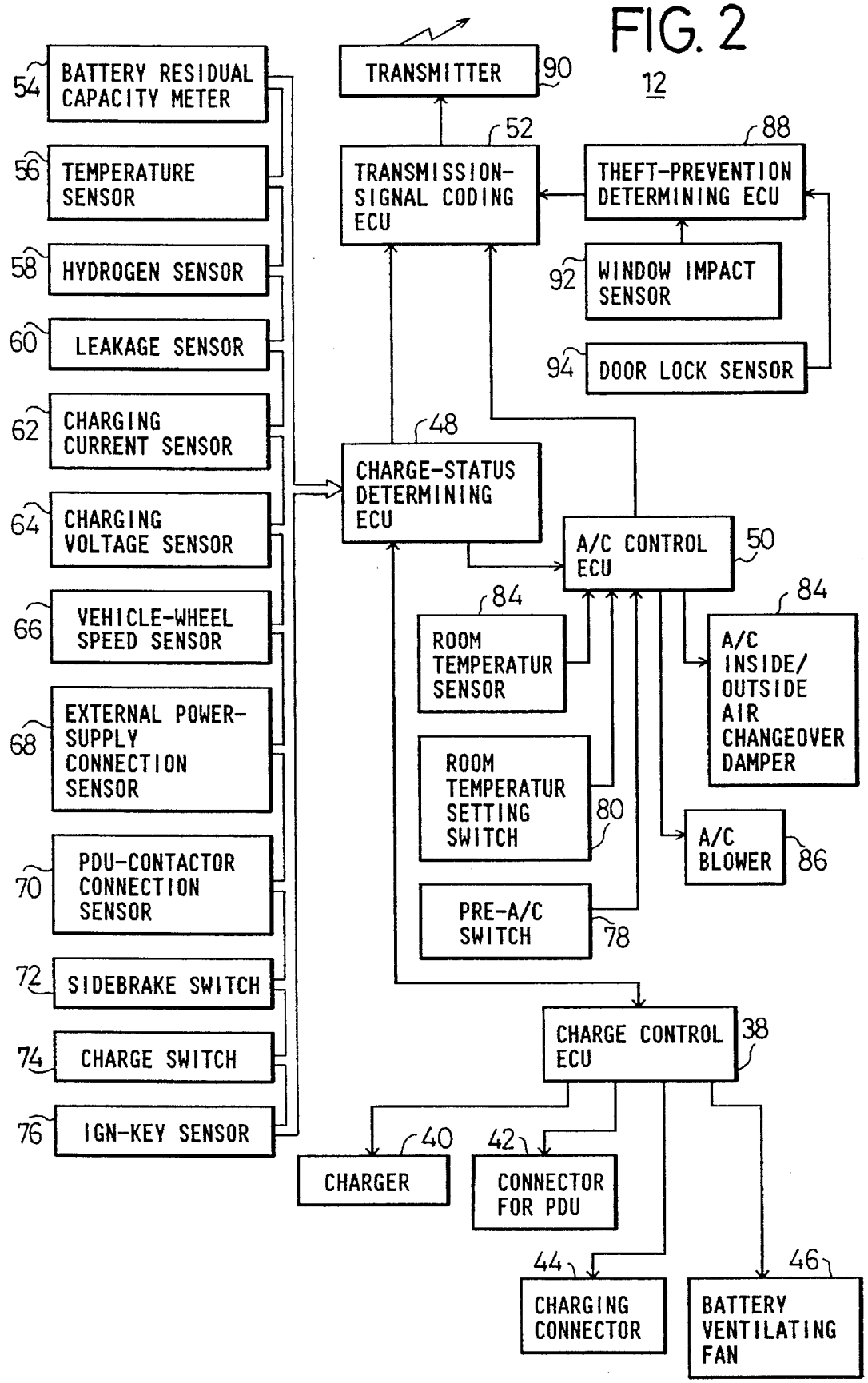
FIG. 2 is a block diagram showing the functional relationship of the components of the system that are provided in the electric vehicle shown in FIG. 1.
Figure 3:
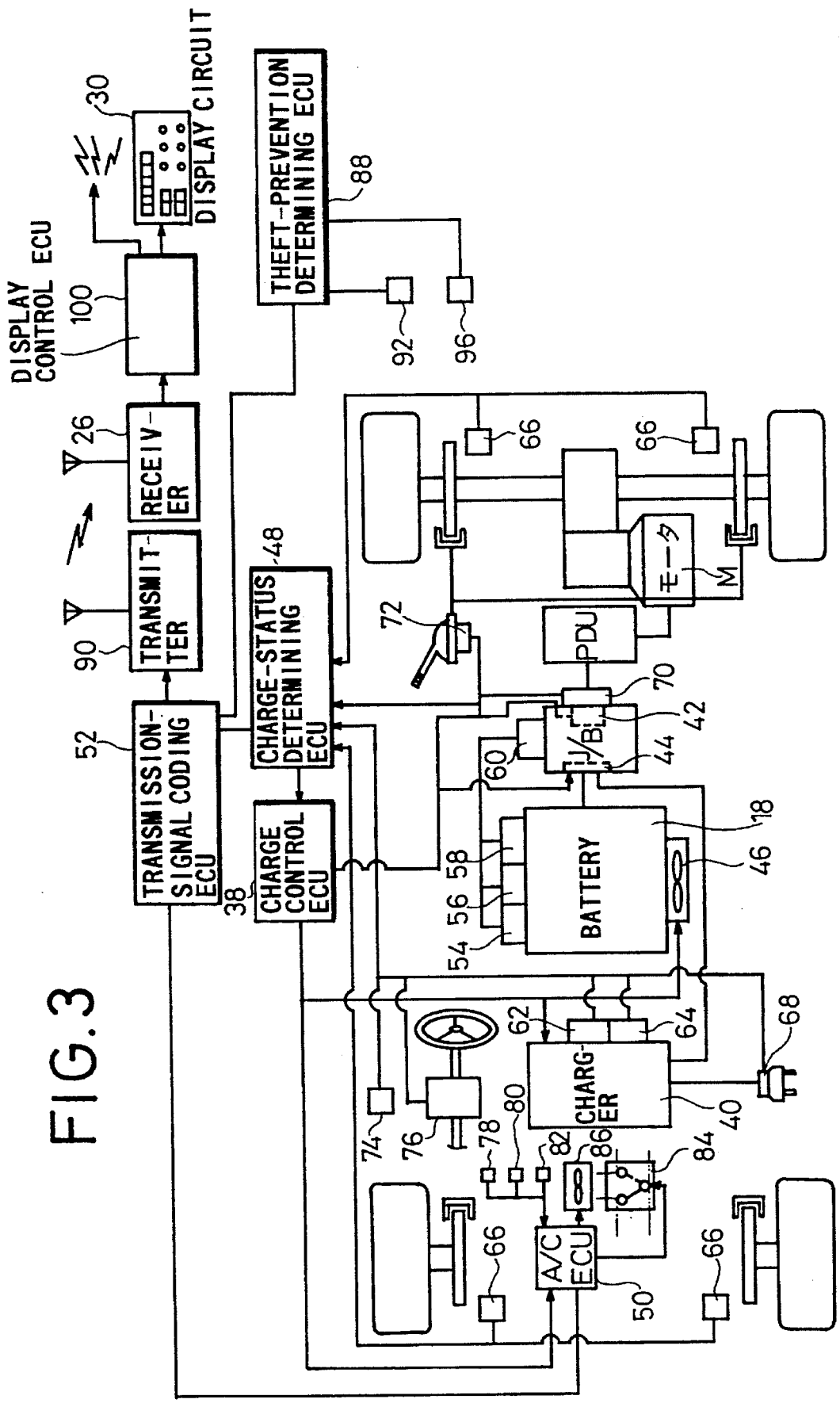
FIG. 3 is a schematic view for describing the configuration of the components of the system in the electric vehicle shown in FIG. 2.

FIG. 2 is a block diagram showing the functional relationship of the components of the system that are provided in the electric vehicle 12. FIG. 3 is a typical layout drawing of the components of the system in the electric vehicle 12.

A charge control electronic control unit (hereinafter called a "charge control ECU") 38 of the charge control circuit 16 is electrically connected to a charger 40, a connector 42 for a power drive unit (hereinafter called a "PDU"), a connector 44 for charging, and a battery ventilating fan 46. The charge control ECU 38 effects the control for energization or de-energization of these components as needed.

The control circuit 22 includes a charge-status determining ECU 48 having a residual-capacity determining function, for judging or determining whether or not the main battery 18 has been fully charged, an air-conditioning (hereinafter called an "A/C") control ECU 50 for determining the state of the vehicle room or interior air-conditioned by an air conditioner, and a transmission-signal coding ECU 52.

The charge-status determining ECU 48 reads the remaining capacity of the main battery 18 from a battery residual capacity meter 54 and also reads the temperature of the main battery 18 using a temperature sensor 56. Further, the charge-status determining ECU 48 detects or reads the concentration or density of hydrogen in a battery box containing the main battery 18 from the output of a hydrogen sensor 58. Furthermore, the charge-status determining ECU 48 determines the state of leakage, i.e., undesired flow of electricity through both a drive electrical-equipment system such as a motor M and a control electrical-equipment system PDU from the output of a leakage sensor 60, and reads both a charging current and a charging voltage from the outputs of a charging current sensor 62 and a charging voltage sensor 64.

The charge-status determining ECU 48 determines, based on a signal outputted from a vehicle-wheel speed sensors 66, whether or not the electric vehicle 12 while being charged is at a stop. Then, the charge-status determining ECU 48 monitors the state of electrical connection between an external power supply and the electric vehicle 12 based on a signal outputted from an external power-supply connection sensor 68 and the state of electrical connection between the main battery 18 and the PDU based on a signal outputted from a PDU-contactor connection sensor 70. Further, the charge-status determining ECU 48 causes the charge control ECU 38 to energize or de-energize the connector 42.

Moreover, the charge-status determining ECU 48 reads the output of a parking brake switch 72 and monitors whether or not the release of the parking brake takes place under the charge. Then, the charge-status determining ECU 48 reads the output of a charge switch 74. Thus, the charge-status determining ECU 48 monitors whether a charging mode has been released before the completion of the charging, and effects a monitoring process based on the output of an ignition key (hereinafter called an "IGN-KEY") sensor 76 in such a manner that the IGN-KEY is not operated and the electric vehicle 12 is not maintained ready for running while the charging is being accomplished.

The A/C control ECU 50 reads set-up states of both a pre-A/C switch 78 and a room temperature setting switch 80, and reads the room temperature detected by a room temperature sensor 82. Thus, the A/C control ECU 50 determines, based on signals indicative of the read information, the status of air conditioning in the vehicle room under pre-air conditioning, and then makes an appropriate switching of an inside/outside air changeover damper 84 and controls an A/C blower 86.

The transmission-signal coding ECU 52 reads signals transmitted from the charge-status determining ECU 48 and the A/C control ECU 50 and digitally codes these signals to data for transmission. Further, the transmission-signal coding ECU 52 sets up a theft-prevention signal read from a theft-prevention determining ECU 88 in code form. These coded signals are outputted to a wireless transmitter 90 from which they are transmitted.

The theft-prevention determining ECU 88 is electrically connected to a window impact sensor 92 and a door lock sensor 94 and determines based on signals detected from both sensors 92 and 94 whether or not an action toward stealing the vehicle has been effected.

Figure 4:
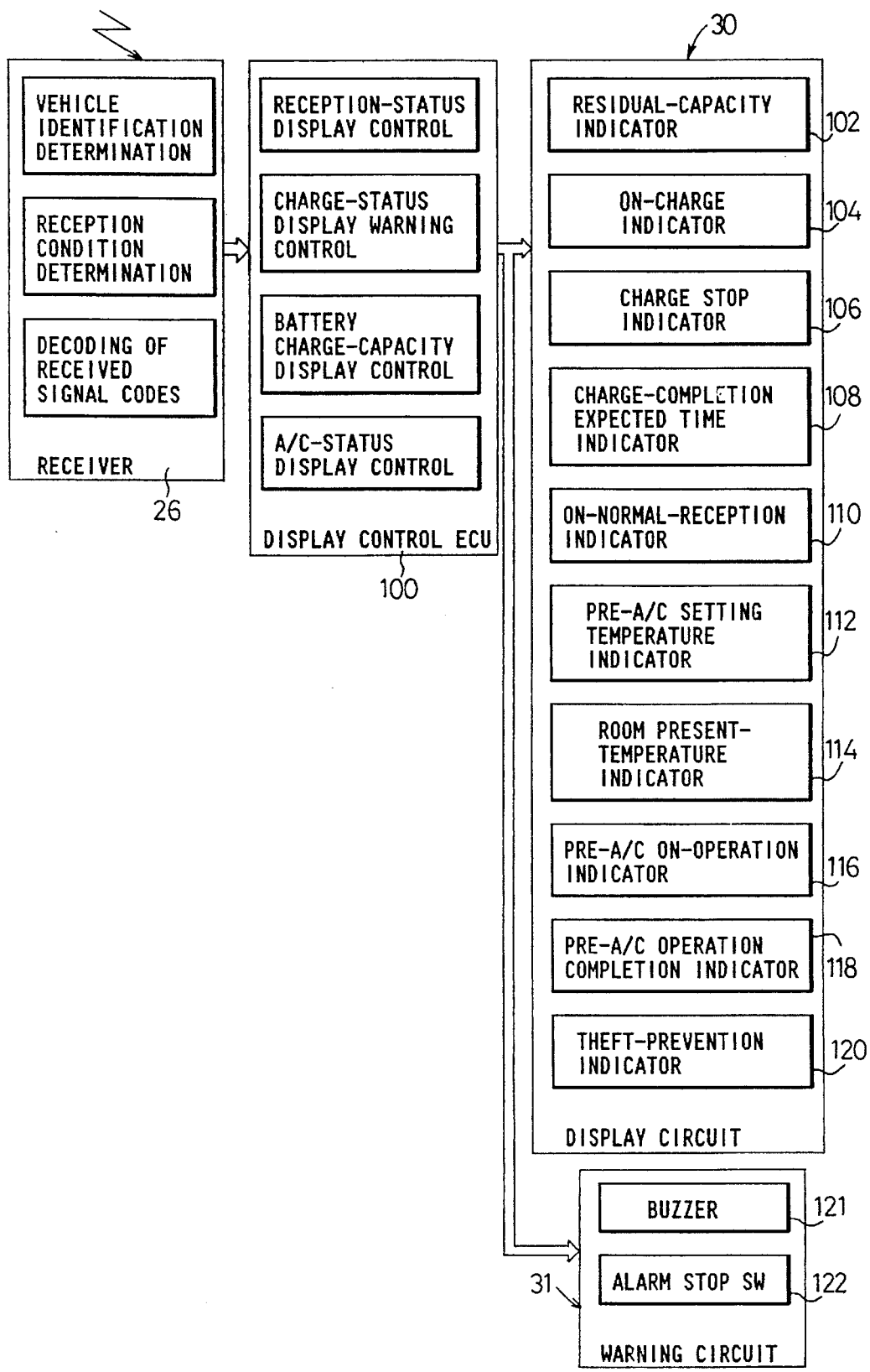
FIG. 4 is a block diagram showing the functional relationship of the components of the system that are provided in a display card employed in the embodiment shown in FIG. 1.
Figure 5:
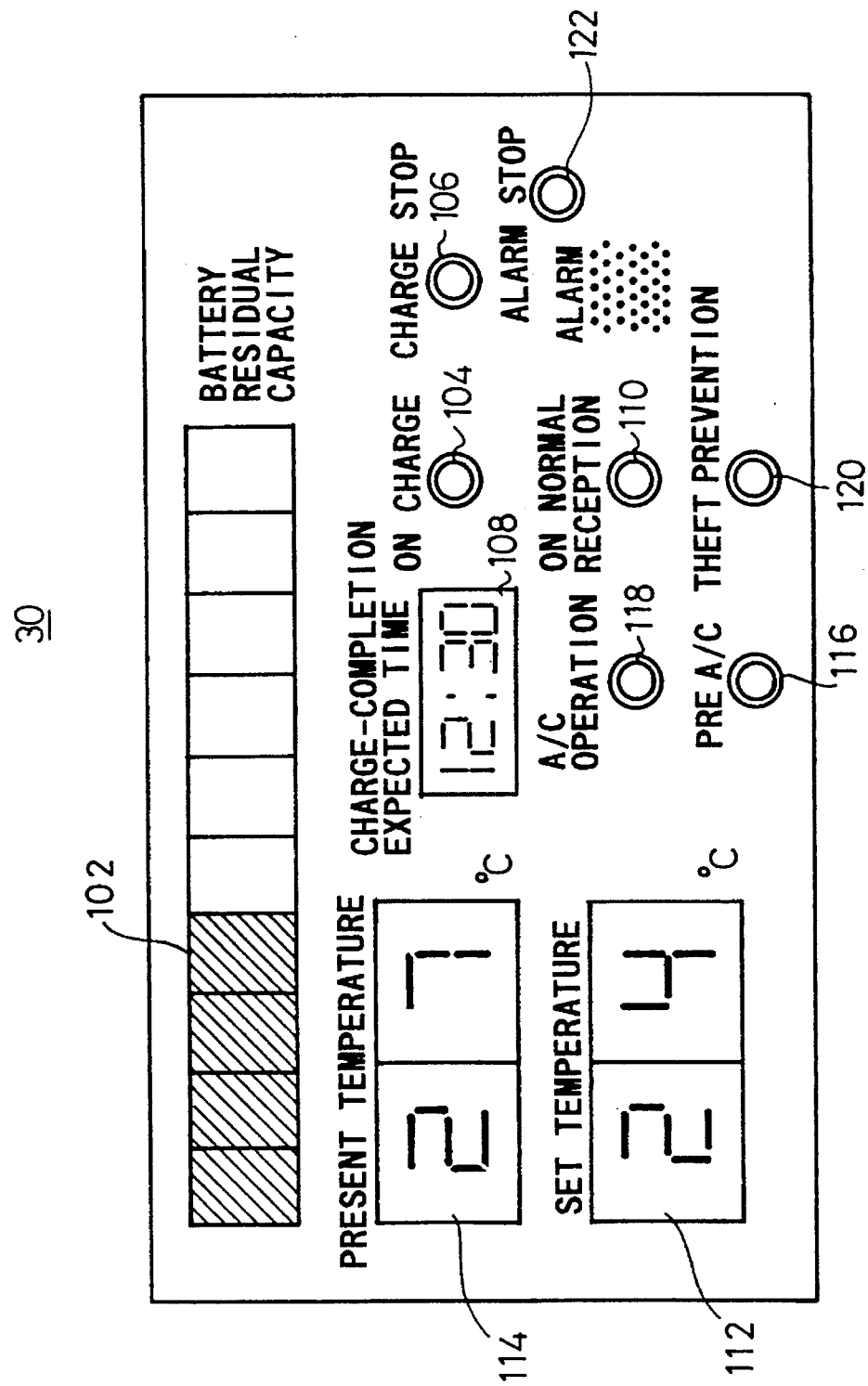
FIG. 5 is a view for describing the configuration of a display circuit employed in the embodiment shown in FIG. 1.

FIG. 4 is a block diagram showing the functional relationship of the components of the system provided in the display card 14. FIG. 5 is a view for describing the layout or configuration of components disposed in the display circuit 30.

The receiver 26 of the display card 14 decodes received signal codes used for determinations of a vehicle identification signal and a reception condition, for example, and supplies the decoded codes to a display control ECU 100 of the display control circuit 28. The display control ECU 100 controls display data used for displaying the state of the signal reception, the state of charging, the remaining capacity of the battery and the state of the pre-A/C, for example, and controls the display circuit 30 and the warning circuit 31 based on the display data.

The display circuit 30 includes indicators such as an indicator 102 for indicating the remaining capacity of the main battery 18, an on-charge indicator 104, a charge stop indicator 106, a charge-completion expected time indicator 108, an on-normal-reception indicator 110, a pre-A/C setting temperature indicator 112, a room or interior present-temperature indicator 114, a pre-A/C on-operation indicator 116, a pre-A/C operation completion indicator 118 and a theft-prevention indicator 120 and the like.

The warning circuit 31 has a buzzer 121 and activates an alarm stop switch 122 so as to stop sounding of the buzzer 121.

The operation of the display system 10 constructed as described above, for receiving therein signals indicative of the state of the charging and the state of the electric vehicle 12 being charged, which have been detected and transmitted by the components located in the electric vehicle 12 and for displaying the same thereon, will now be described below with reference to FIGS. 6 through 21.

Figure 6:
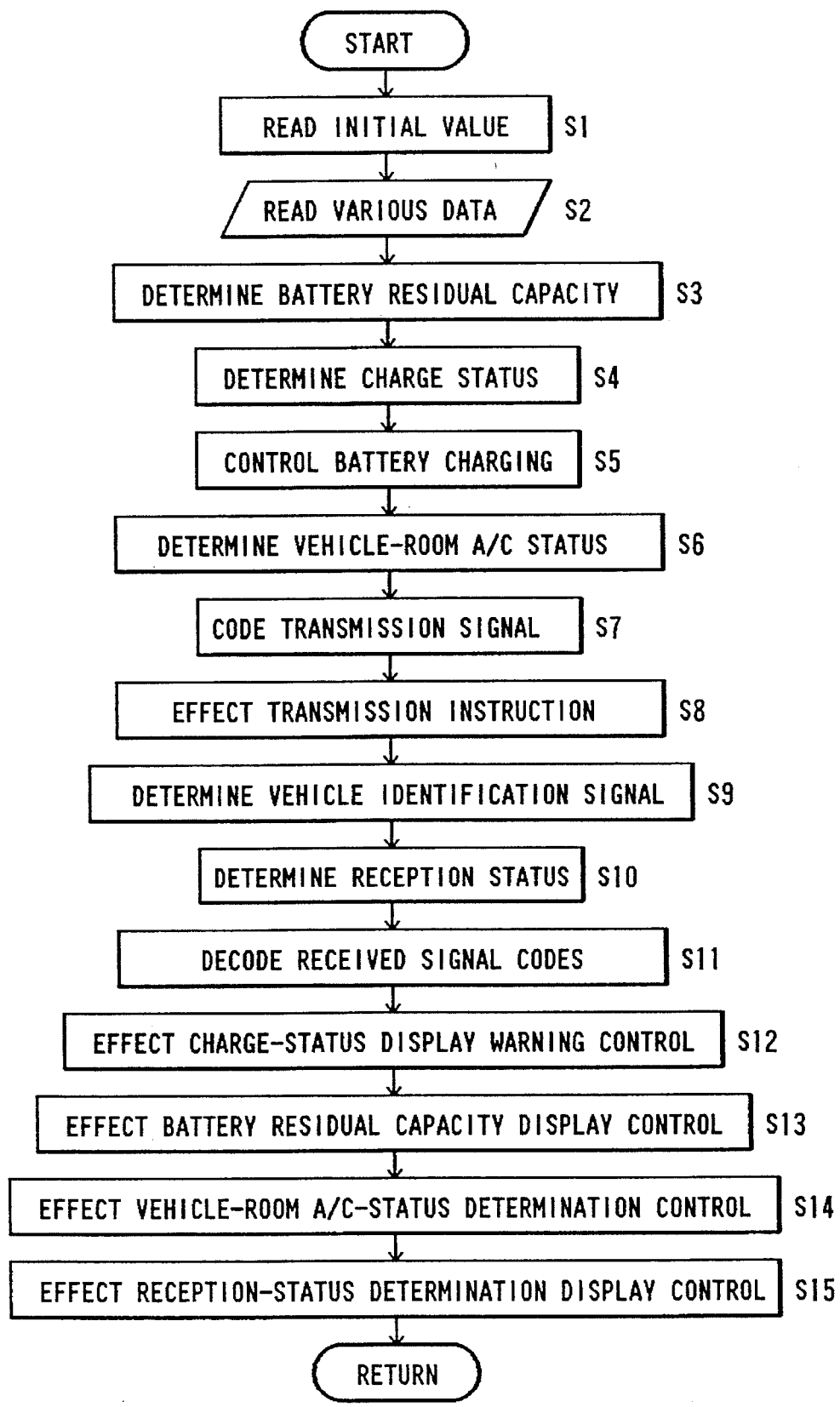
FIG. 6 is a flowchart for describing, in general, a sequential routine for use in displaying information detected in accordance with the embodiment shown in FIG. 1.
Figure 7:
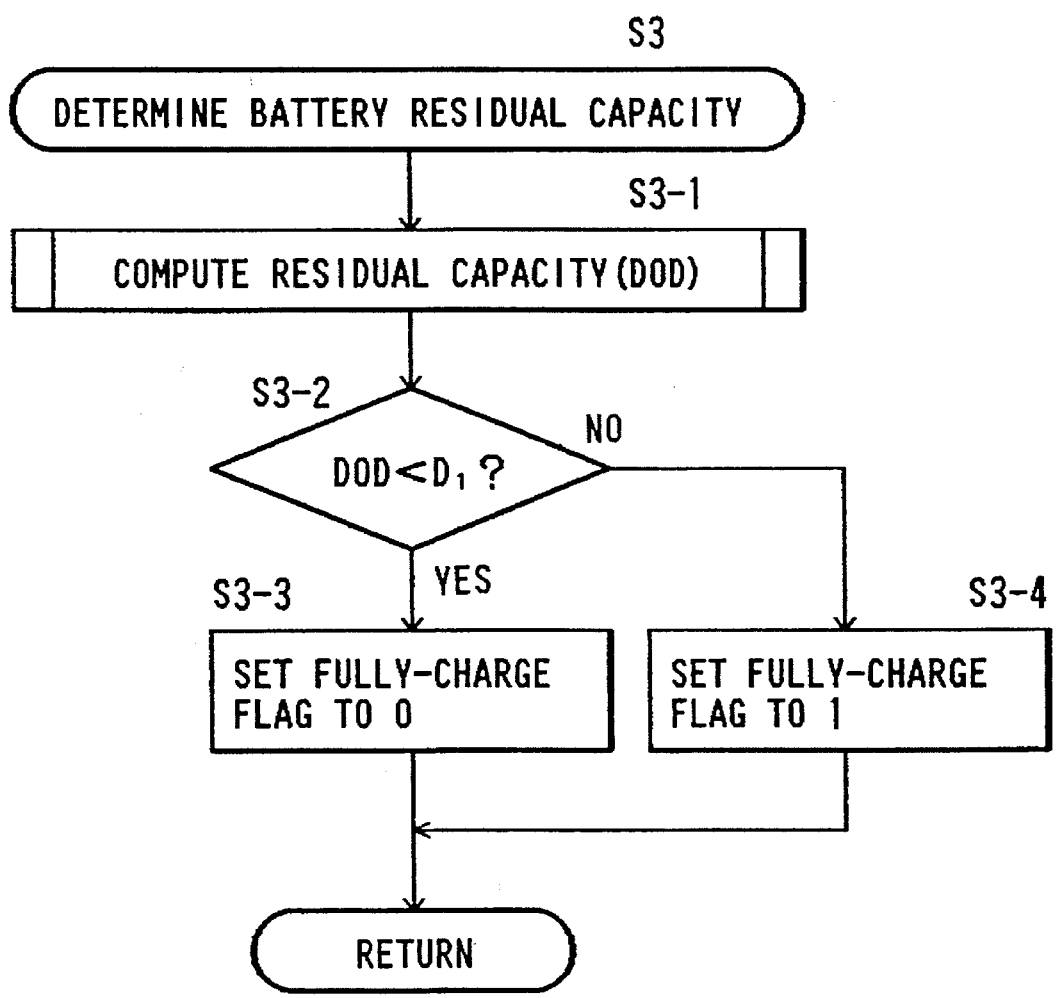
FIG. 7 is a flowchart for describing, in detail, a routine used in the sequential routine for displaying the detected information shown in FIG. 6.
Figure 8:
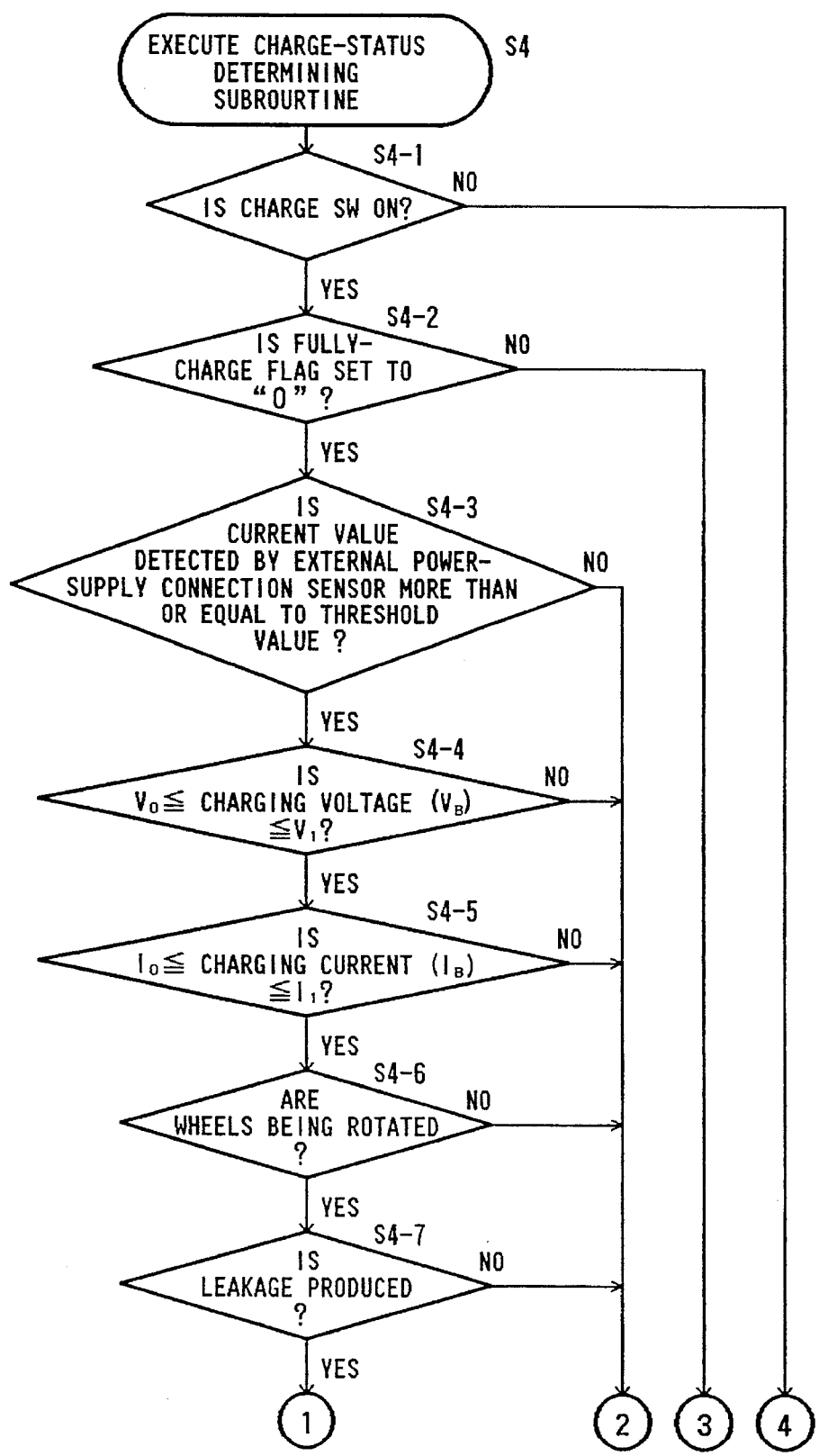
FIG. 8 is a flowchart for describing, in detail, another routine used in the sequential routine for displaying the detected information shown in FIG. 6.
Figure 9:
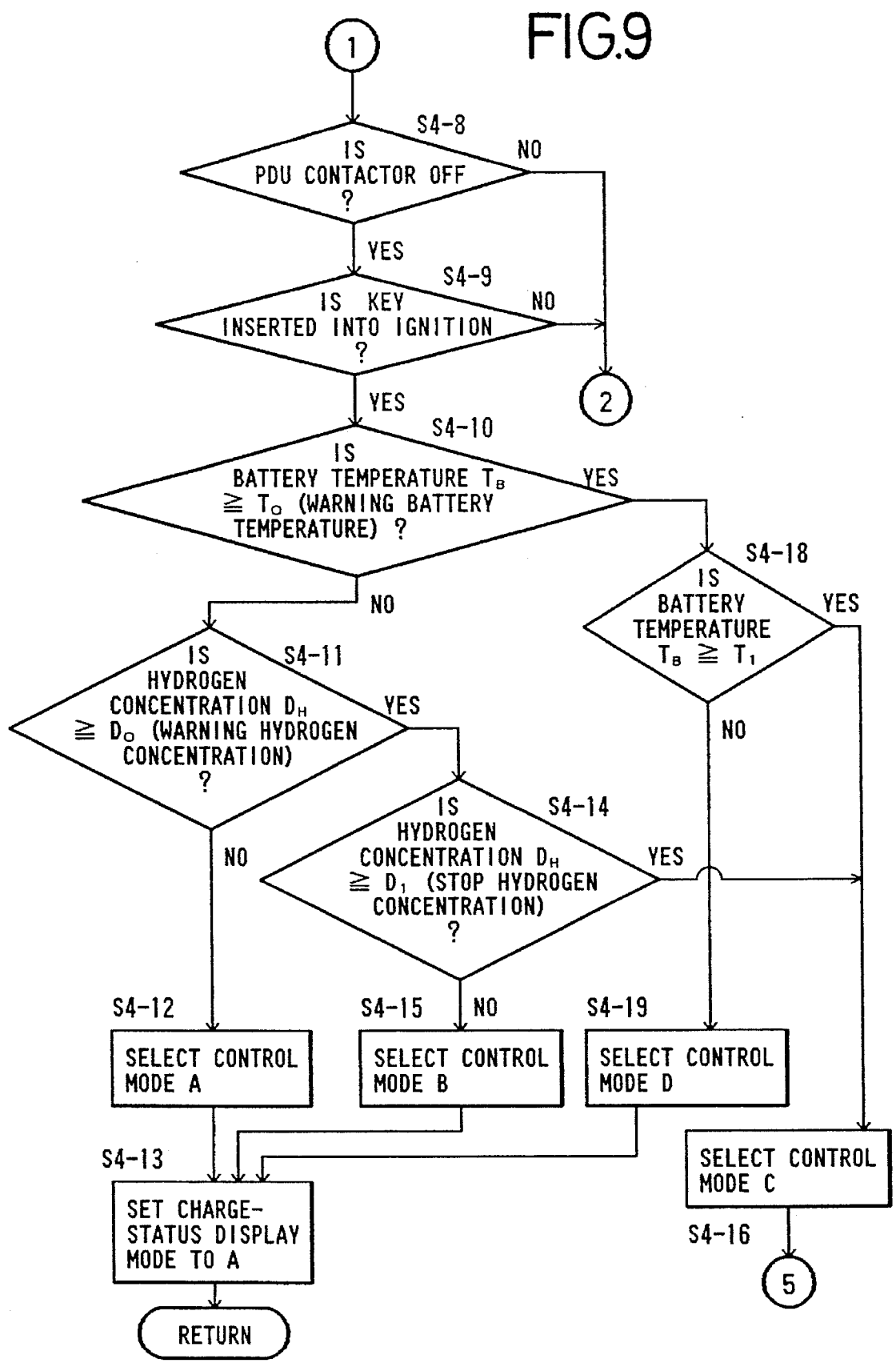
FIG. 9 is a flowchart for describing, in detail, a further routine used in the sequential routine for displaying the detected information shown in FIG. 6.

FIG. 6 is a main flowchart illustrative of the above operation or sequential routine.

The control circuit 22 of the electric vehicle 12 reads an initial value such as a vehicle identification number or the like set or stored in an unillustrated storage circuit (Step S1) and reads the outputs of the respective sensors of the detection circuit 20 and the status set up by the setting switch (Step S2).

Next, the control circuit 22 computes a depth-of-discharge ("DOD") of the main battery 18 based on the output signal of the battery residual capacity meter 54, which has been read in Step S2, and determines the fully-charged capacity of the main battery 18 from the value of the computed depth-of-discharge. Further, the control circuit 22 determines the present residual capacity DOD with respect to the fully-charged capacity (Step S3). When the charging of the main battery 18 is initiated according to the residual capacity DOD, the charge-status determining ECU 48 judges or determines the state of charging of the main battery 18 (Step S4). Then, the charge control ECU 38 responds to emergency conditions which may occur during a battery charging period (Step S5). Then, the A/C control ECU 50 determines the state of air conditioning under the pre-A/C control (Step S6).

The transmission-signal coding ECU 52 sets up the signals outputted from the charge-status determining ECU 48 and the A/C control ECU 50 in code form (Step S7), and the wireless transmitter 24 transmits the coded signals in accordance with a transmission command or instruction (Step S8).

On the other hand, the receiver 26 of the display card 14 receives therein the signals transmitted from the wireless transmitter 24. Further, the receiver 26 reads or selects a vehicle identification signal from these signals and determines whether or not the read identification signal represents a signal corresponding to the corresponding display card 14 (Step S9). After it has been judged from the strength of the received electric wave, i.e., the received signal, that the display card 14 falls within a receivable range (Step S10), the received signal codes are decoded (Step S11).

The display circuit 30 displays the state of charging of the main battery while being charged and the like based on the result of the decoding. When the contents of the signal relating to whether the operator is to be warned are decoded and indicate "yes", the warning circuit 31 is energized to sound the buzzer 121 (Step S12). Further, the remaining capacity of the main battery 18 is displayed on the residual-capacity indicator 102 (Step S13), and the status of the present air conditioning is displayed on the pre-A/C on-operation indicator 116 (Step S14).

Then, a the on-normal-reception indicator 110 visually displays whether or not the displayed contents are valid (Step S15). Next, the routine procedure is returned to START and the control and determination processes of Steps S1 through S15 are repeatedly executed.

The detected signals are displayed on the display card 14 in accordance with the Steps described above. On the other hand, a method of controlling the operations or routines to be executed in the respective steps illustrated in FIG. 6 will next be described below in detail with reference to FIGS. 7 through 21.

A routine for determining the residual capacity of the main battery 18 is executed in Step S3. That is, the charge-status determining ECU 48 computes the remaining capacity DOD of the main battery 18 based on the signal read or detected from the battery residual capacity meter 54 (Step S3-1 in FIG. 7). Then, the charge-status determining ECU 48 compares the residual capacity DOD with a capacity D1 produced when the main battery 18 is fully charged, and determines based on the result of that comparison whether or not DOD<D1 (Step S3-2). If the answer is determined to be YES (i.e., DOD<D1), then a fully-charged flag is set to "0" (Step S3-3). If the answer is determined to be NO in Step S3-2, then the fully-charged flag is set to "1" (Step S3-4) and the routine procedure is returned to the main routine (see FIG. 7).

When the fully-charged flag is set to "1" as a result of the above determination, i.e., when the residual capacity DOD of the main battery 18 is set equal to the fully-charged capacity D1, the battery residual-capacity indicator 102 of the display circuit 30 lights up and the present time is displayed on the charge-completion expected time indicator 108. Further, the charge stop indicator 106 is lighted. When, on the other hand, the fully-charged flag is set to "0", the battery residual-capacity indicator 102 is lighted so as to correspond to the computed residual capacity DOD. Further, the charge-completion expected time determined by computation is represented by the charge-completion expected time indicator 108 and the on-charge indicator 104 will light up.

A charge-status determining subroutine of Step S4 will next be described. The charge-status determining subroutine is executed in accordance with respective conditions to be described below in such a manner that the charge-status determining ECU 48 selects any one of control modes A through E (see FIGS. 8 through 10).

It is first determined whether or not the charge switch 74 is in an operated state (Step S4-1). If the answer is determined to be YES, it is then determined whether or not a fully-charged flag has been set to "0" (Step S4-2). If the answer is determined to be YES in Step S4-2, it is then determined whether or not the value of current detected by the external power-supply connection sensor 68 is more than or equal to a threshold value (Step S4-3).

If the answer is determined to be YES in Step S4-3, it is then determined whether or not a voltage $V_B$ detected by the charging voltage sensor 64 falls between predetermined voltages $V_O$ and $V_1$ (i.e., $V_O \leq V_B \leq V_1$) (Step S4-4). If the answer is determined to be YES in Step S4-4, it is then determined whether or not a current $I_B$ detected by the charging current sensor 62 falls between predetermined currents $I_O$ and $I_1$ (i.e., $I_O \leq I_B \leq I_1$) (Step S4-5).

If the answer is determined to be YES in Step S4-5, then the charge-status determining ECU 48 reads the output of the vehicle-wheel speed sensor 66 and determines whether or not the wheels are rotating (Step S4-6). If the answer is determined to be NO in Step S4-6, then the charge-status determining ECU 48 reads the output of the leakage sensor 60 and determines whether or not leakage current, i.e., undesired flow of electricity has been produced (Step S4-7). If the answer is determined to be NO in Step S4-7, it is judged based on the output of the PDU-contactor connection sensor 70 whether or not the contactor for the PDU is in a de-energized state (Step S4-8). If the answer is determined to be YES in Step S4-8, it is then determined that the electric power has not been supplied to the motor. The charge-status determining ECU 48 then reads the output of the IGN-KEY sensor 76 and determines whether or not a key has been inserted into the vehicle ignition (Step S4-9).

If the answer is determined to be NO in Step S4-9, it is then determined whether or not the main battery temperature $T_B$ detected or read from the temperature sensor 56 is more than or equal to a set warning battery temperature $T_O$ ($T_B \geq T_O$) (Step S4-10). If the answer is determined to be NO in Step S4-10, then the charge-status determining ECU 48 reads or detects the output of the hydrogen sensor 58 and determines whether or not the detected hydrogen density or concentration $D_H$ is more than or equal to a set warning hydrogen concentration $D_O$ (i.e., $D_H \leq D_O$) (Step S4-11). If the answer is determined to be NO in Step S4-11, then the charge-status determining ECU 48 selects control mode A (Step S4-12) and sets a charge-status display mode to A (Step S4-13). This charge-status display mode A represents a normal on-charge or charging state.

If the answer is determined to be YES in Step S4-11, it is then determined whether or not the detected hydrogen concentration $D_H$ is more than or equal to a charge stop hydrogen concentration $D_1$ (Step S4-14). If the answer is determined to be NO in Step S4-14, then the control mode B to be described later is selected (step S4-15) and the charge-status display mode is set to A (Step S4-13). The control mode B represents that the detected hydrogen concentration $D_H$ is higher than the warning hydrogen concentration $D_O$ and lower than the charge stop hydrogen concentration $D_1$ (i.e., $D_O \leq D_H \leq D_1$). Therefore, the control for the ventilation of the vehicle room and the ventilation of the battery accommodating box or room is effected under control mode B.

Figure 10:
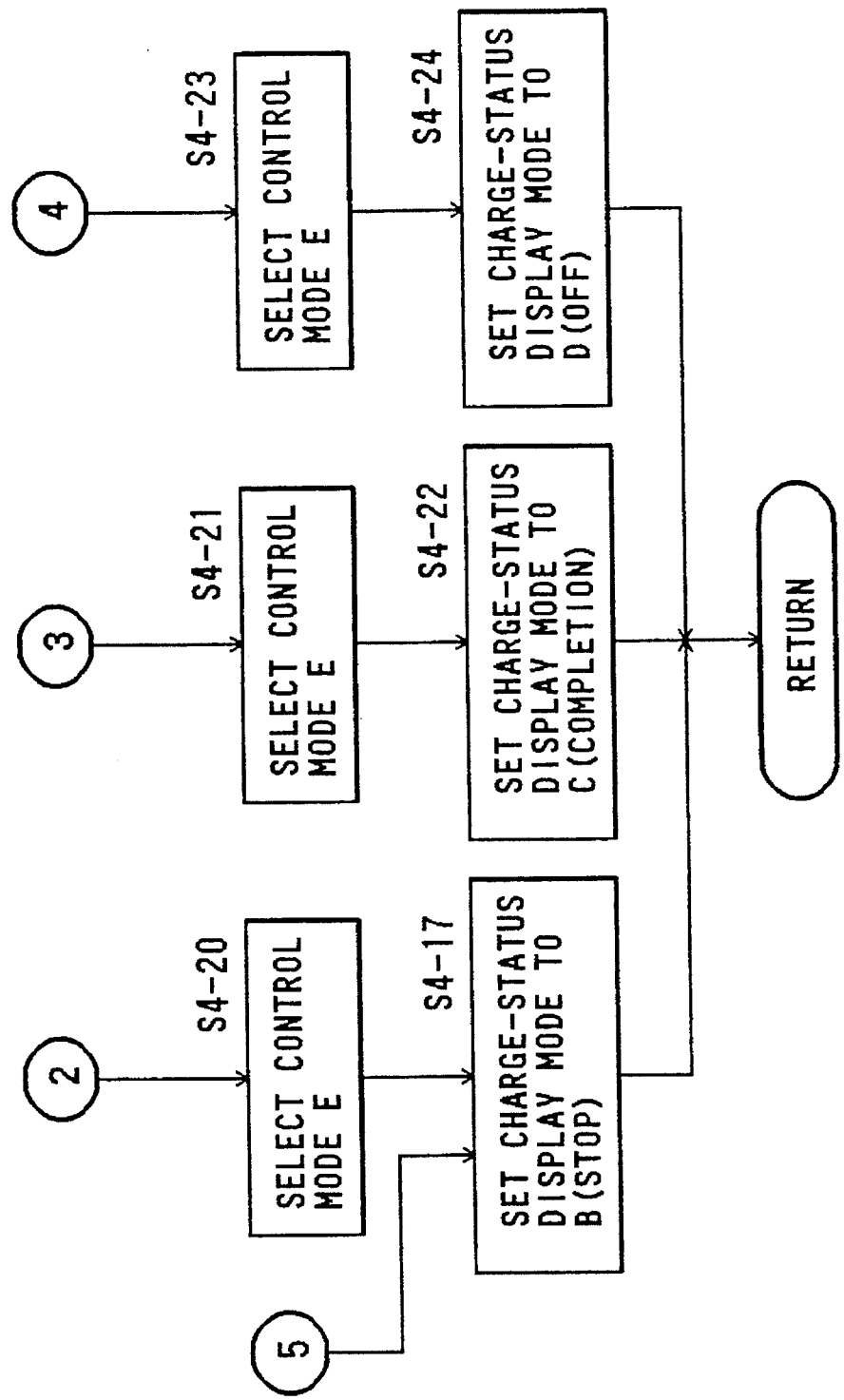
FIG. 10 is a flowchart for describing, in detail, a still further routine used in the sequential routine for displaying the detected information shown in FIG. 6.
Figure 11:
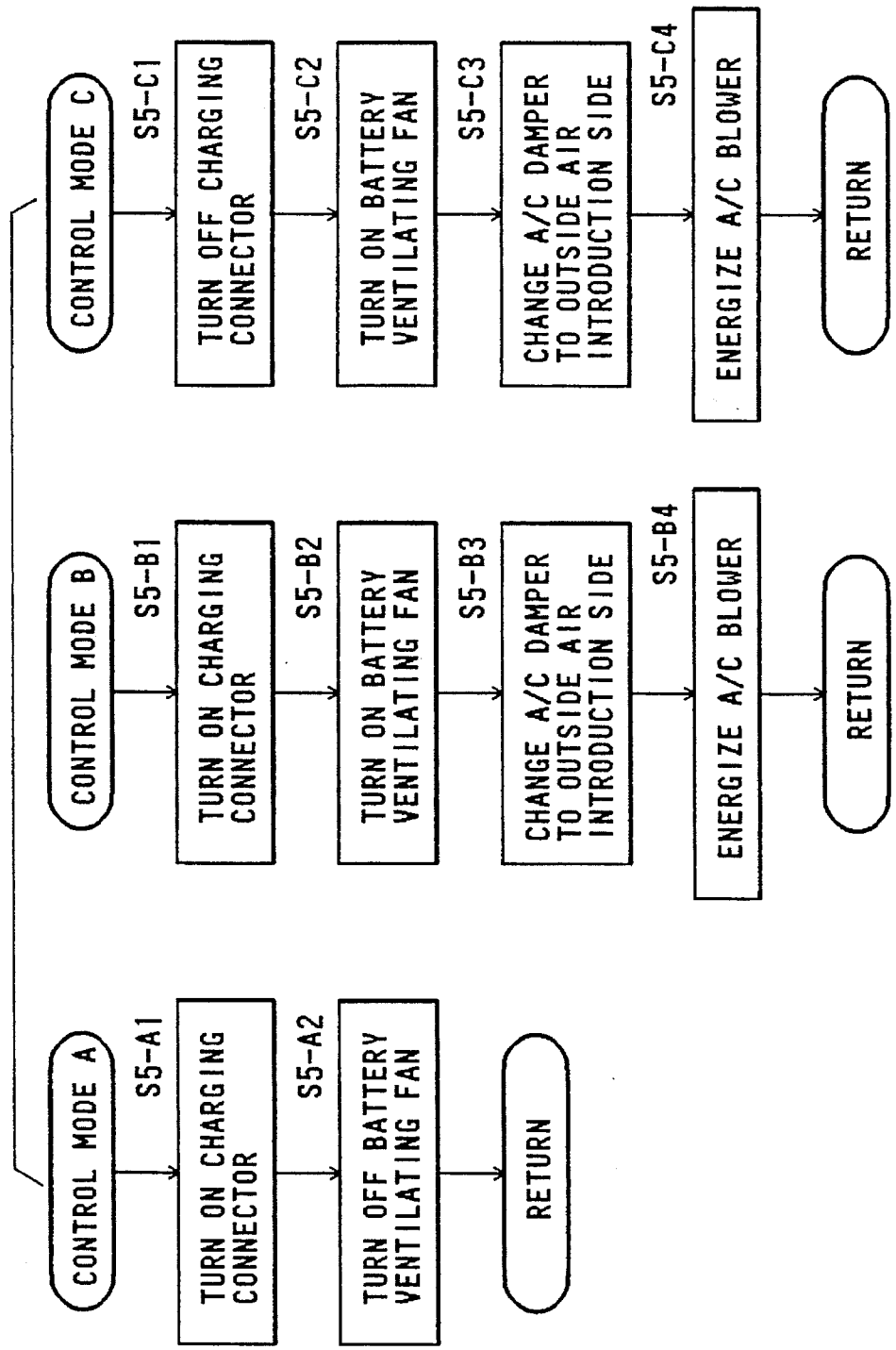
FIG. 11 is a flowchart for describing, in detail, a still further routine used in the sequential routine for displaying the detected information shown in FIG. 6.
Figure 12:
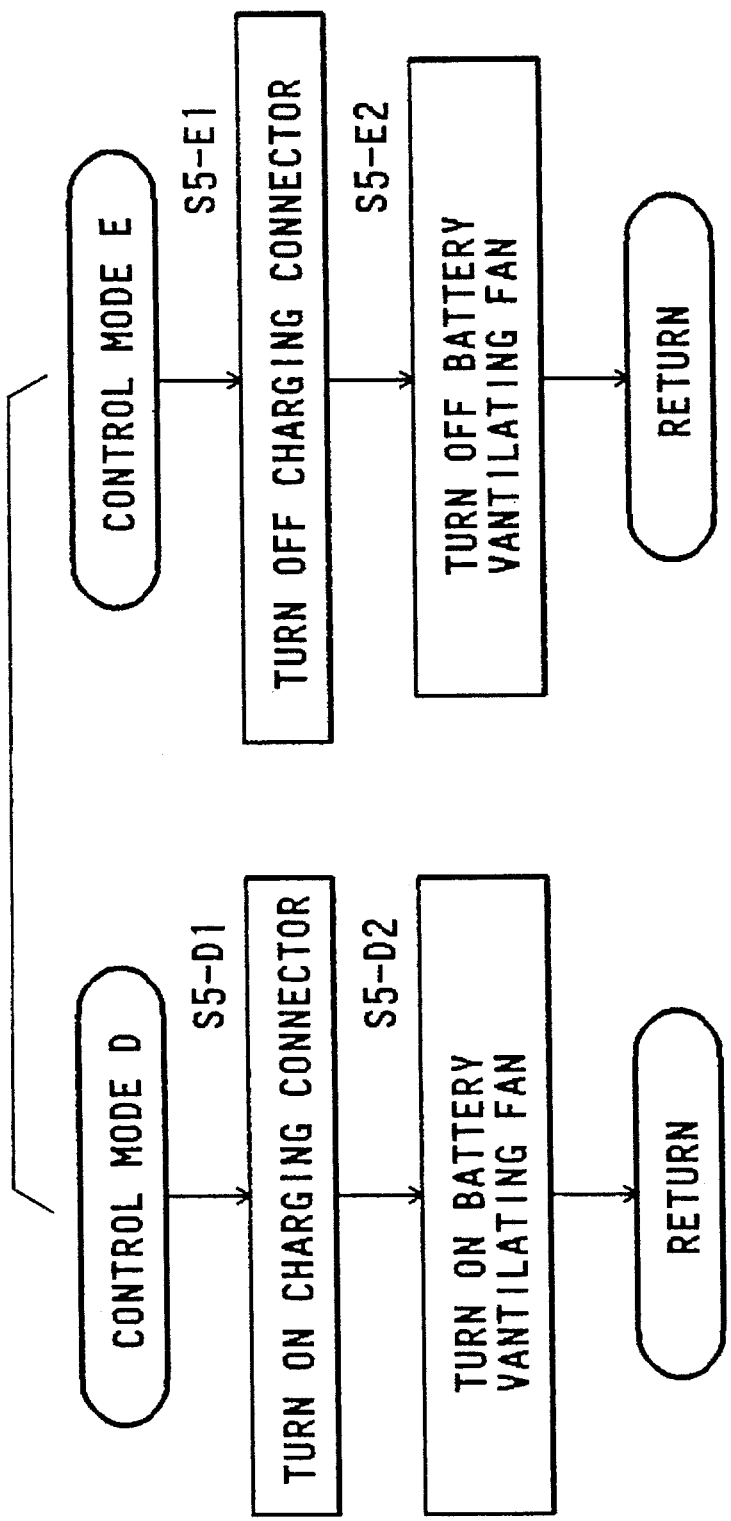
FIG. 12 is a flowchart for describing, in detail, a still further routine used in the sequential routine for displaying the detected information shown in FIG. 6.

If the answer is determined to be YES in Step S4-14 (i.e., $D_H \geq D_1$), then control mode C is selected (Step S4-16) and the charge-status display mode is set to B (Step S4-17 in FIG. 10). Charge-status display mode B represents a charge stop.

Further, if the answer is determined to be YES in Step S4-10 (i.e., $T_B \geq T_O$), it is then determined whether or not the detected battery temperature $T_B$ is more than or equal to a charge stop battery temperature $T_1$ (Step S4-18). If the answer is determined to be YES in Step S4-18 (i.e., $T_B \geq T_1$), then control mode C is selected (Step S4-16). If the answer is determined to be NO in Step S4-18, then control mode D is selected (S4-19) and the charge-status display mode is brought to A (Step S4-13).

If, on the other hand, the results of the determinations in Steps S4-3, S4-4, S4-5 or S4-8 are selected as NO or Steps S4-6, S4-7 or S4-9 are selected as YES, then the control mode E is selected (Step S4-20 in FIG. 10) and the charge-status display mode is set to B (Step S4-17) to stop or prevent charging.

When the fully-charged flag is represented as "1" as a result of the determination in Step S4-2, it is determined that the battery has been fully charged, and the control mode E for effecting the charge completion control is selected (Step S4-21 in FIG. 10). The charge-status display mode is set to C which represents the completion of the battery charging (Step S4-22).

If the answer is determined to be NO in Step S4-1, then the control mode E indicative of the completion of the battery charging is selected (Step S4-23). The charge-status display mode is brought to D which represents "OFF" (Step S4-24).

The charge-status determining subroutine is executed in accordance with the above Steps. On the other hand, battery charging control is executed in Step S5 in accordance with the control modes A through E which have been determined in the charge-status determining subroutine. Therefore, the aforementioned respective charge control modes A through E will now be described with reference to FIGS. 11 and 12.

Control mode A represents that the battery is being charged in a normal state. Under control mode A, contacts of the connector 44 are made conductive (Step S5-A1) and the battery ventilating fan 46 is de-energized (Step S5-A2).

Control mode B represents that the detected hydrogen density or concentration $D_H$ in the battery accommodating room falls between the warning hydrogen concentration $D_O$ and the charge stop hydrogen concentration $D_1$ (i.e., $D_O<D_H<D_D$). Thus, under control mode B, the hydrogen in the battery accommodating box or room is discharged to the outside of the vehicle and the room or interior of the vehicle is ventilated while the battery is being charged continuously.

More specifically, the contacts of the connector 44 are brought to the conducting state (Step S5-B1) and the battery ventilating fan 46 is energized (Step S5-B2). Further, the inside/outside air changeover damper 84 is switched to the outside air introduction side (Step S5-B3) and the A/C blower 86 is energized so as to provide the maximum exhaust capacity (Step S5-B4).

Control mode C represents that the detected battery temperature $T_B$ is more than or equal to the charge stop battery temperature $T_1$ or the detected hydrogen concentration $D_H$ in the battery accommodating box or room is more than or equal to the charge stop hydrogen concentration $D_1$.

Therefore, the contacts of the connector 44 are made non-conductive (Step S5-C1) to stop the charging of the main battery 18 and the battery ventilating fan 46 is energized (Step S5-C2). Further, the inside/outside air changeover damper 84 is changed over to the outside air introduction side (Step S5-C3) and the A/C blower 86 is energized to produce the maximum exhaust capacity (Step S5-C4), thereby ventilating the battery accommodating box or room and the vehicle interior.

Control mode D represents that the detected battery temperature $T_B$ is more than the warning battery temperature $T_O$ and less than the charge stop battery temperature $T_1$ (i.e., $T_O<T_B<T_1$). Control mode D is used to ventilate the battery accommodating room while the battery charging is being continuously effected and to lower the temperature of the main battery 18. To this end, the contacts of the connector 44 are made conductive (Step S5-D1) and the battery ventilating fan 46 is energized (Step S5-D2).

Control mode E represents a charge completion mode. Therefore, the contacts of the connector 44 are rendered non-conductive (Step S5-E1) so as to stop the charging of the main battery 18. Further, the battery ventilating fan 46 is deenergized to terminate the ventilation of the battery accommodating box or room (Step S5-E2).

Figure 13:
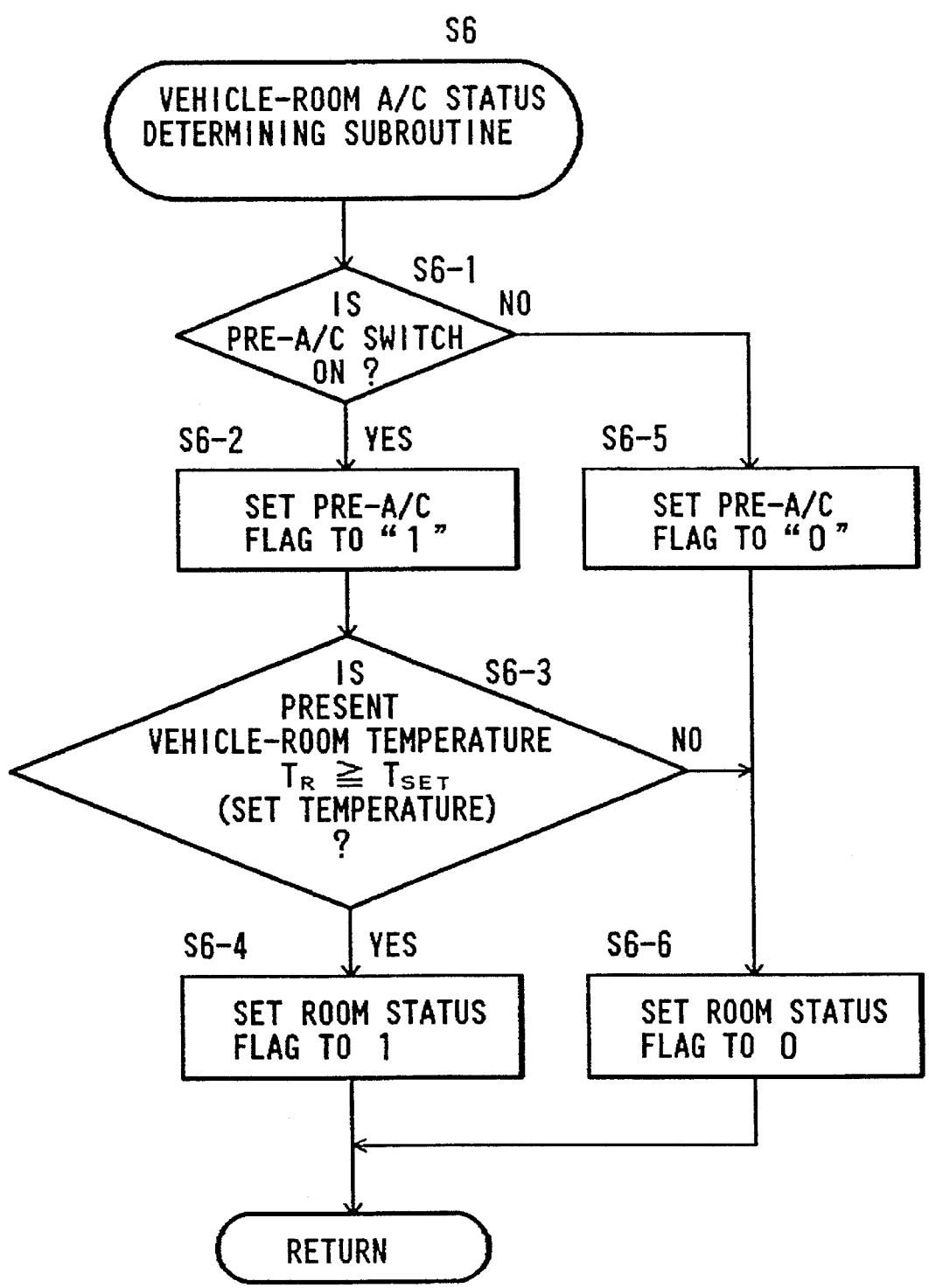
FIG. 13 is a flowchart for describing, in detail, a still further routine used in the sequential routine for displaying the detected information shown in FIG. 6.

Next, a vehicle-room A/C status determining subroutine to be executed in Step S6 will be described with reference to FIG. 13.

When the charging of the main battery 18 is started, the A/C control ECU 50 determines whether or not the pre-A/C switch 78 is in an operated state (Step S6-1) indicating whether the vehicle operator wishes to have the interior of the vehicle air-conditioned before (i.e. "pre") the anticipated time for driving the vehicle. If the answer is determined to be YES, then a pre-A/C flag is set to "1" (Step S6-2). It is then determined whether or not the room temperature $T_R$ read by the room temperature sensor 82 is more than or equal to a temperature $T_{SET}$ set by the room temperature setting switch 80 (Step S6-3). If $T_R \geq T_{SET}$, then a room status flag is set to "1" (Step S6-4) and the routine procedure is returned to the main routine.

If the answer is determined to be NO in Step S6-1, then the pre-A/C flag is set to "0" (Step S6-5) and the room status flag is set to "0" (Step S6-6). Further, the routine procedure is returned to the main routine. If the answer is determined to be NO in Step S6-3, i.e., if the temperature of the vehicle interior is less than the set temperature $T_{SET}$, it is then unnecessary to cool the vehicle room by the air conditioner. Therefore, the room status flag is set to "0".

Figure 14:
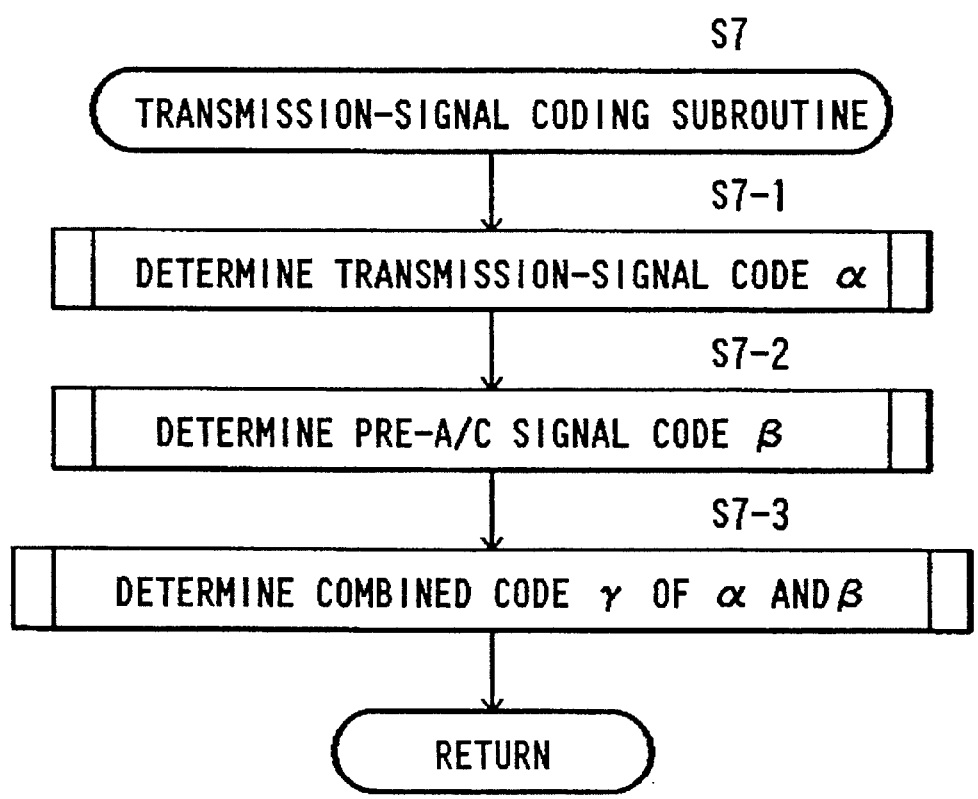
FIG. 14 is a flowchart for describing, in detail, a still further routine used in the sequential routine for displaying the detected information shown in FIG. 6.

A subroutine for coding a transmission signal, which is executed in Step S7, will next be described with reference to FIGS. 14 and 15.

FIG. 15(a) shows a map produced by setting up the remaining capacity of the main battery 18 and the charge-status display modes representative of the on-charge, the charge completion, the charge stop and the OFF modes in code form. FIG. 15(b) illustrates a map created by coding the room status flag under the A/C and the pre-A/C status flag. FIG. 15(c) shows a map for obtaining transmission codes from the coded data produced from the maps shown in FIGS. 15(a) and 15(b).

The transmission-signal coding ECU 52 reads data indicative of the battery residual capacity DOD outputted from the charge-status determining ECU 48, e.g. data corresponding to 10%, and data determined in Step S4 and outputted from the charge control ECU 38, e.g., data indicative of the on-charge defined by the charge-status display mode A. The transmission-signal coding ECU 52 determines data, for example, $\alpha$="Cl" based on the data indicative of the residual capacity, i.e., the data corresponding to 10% and the data indicative of the on-charge by reference to the map shown in FIG. 15(a) (Step S7-1).

On the other hand, the transmission-signal coding ECU 52 judges or determines the pre-A/C status by reference to the map shown in FIG. 15(b) in accordance with the signals indicative of the pre-A/C status, which are outputted to the transmission signal coding ECU 52 from the A/C control ECU 50, e.g., "1" set of the pre-A/C control flag and "0" set of the room status flag, thereby determining coded data $\beta$="El" (Step S7-2).

Then, data $\gamma_{b23}$ is determined based on the data $\alpha$="Cl" and the data $\beta$="El" by reference to the map shown in FIG. 15(c), thereby producing coded data corresponding to the data $\gamma_{b23}$ (Step S7-3).

Figure 16:
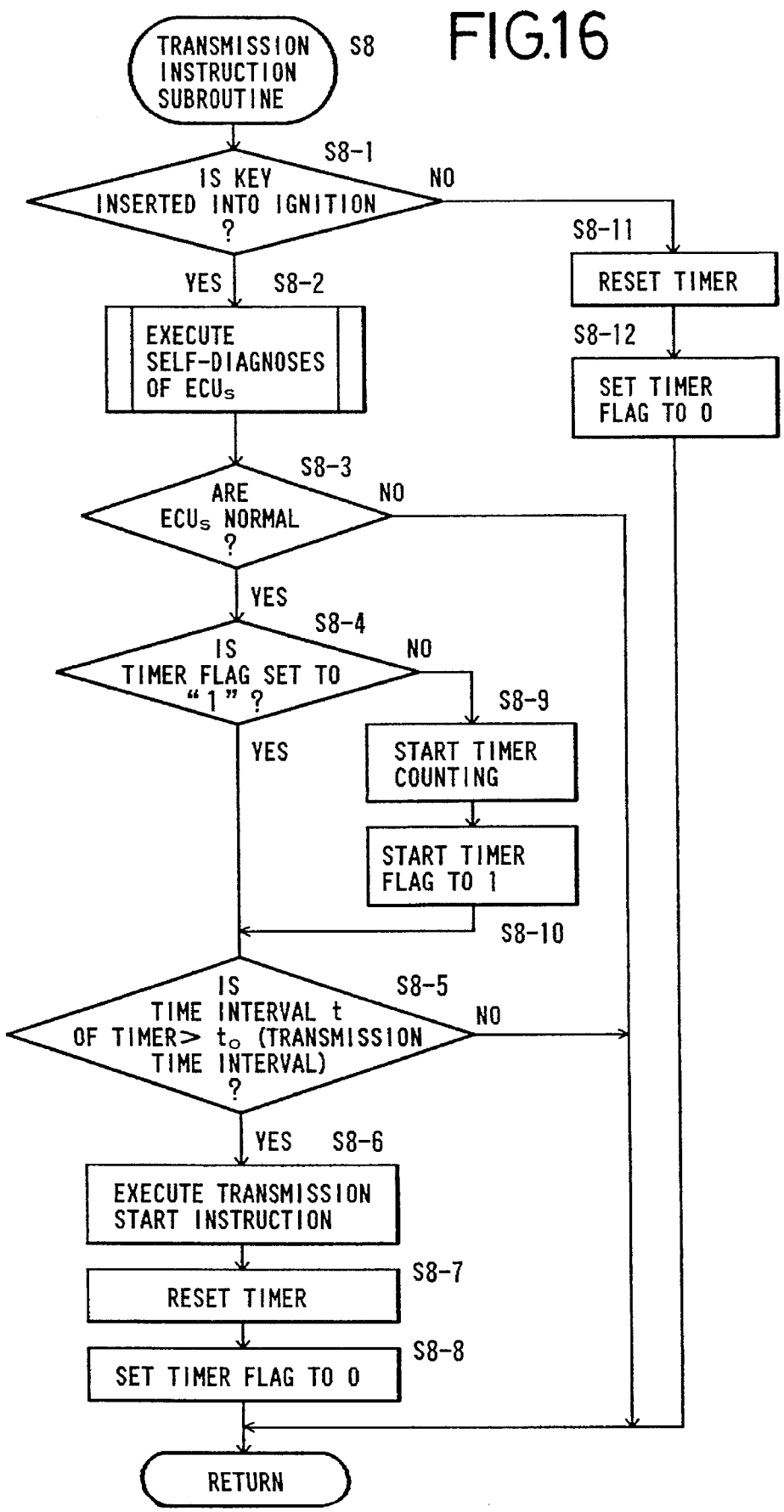
FIG. 16 is a flowchart for describing, in detail, a still further routine used in the sequential routine for displaying the detected information shown in FIG. 6.
Figure 17:
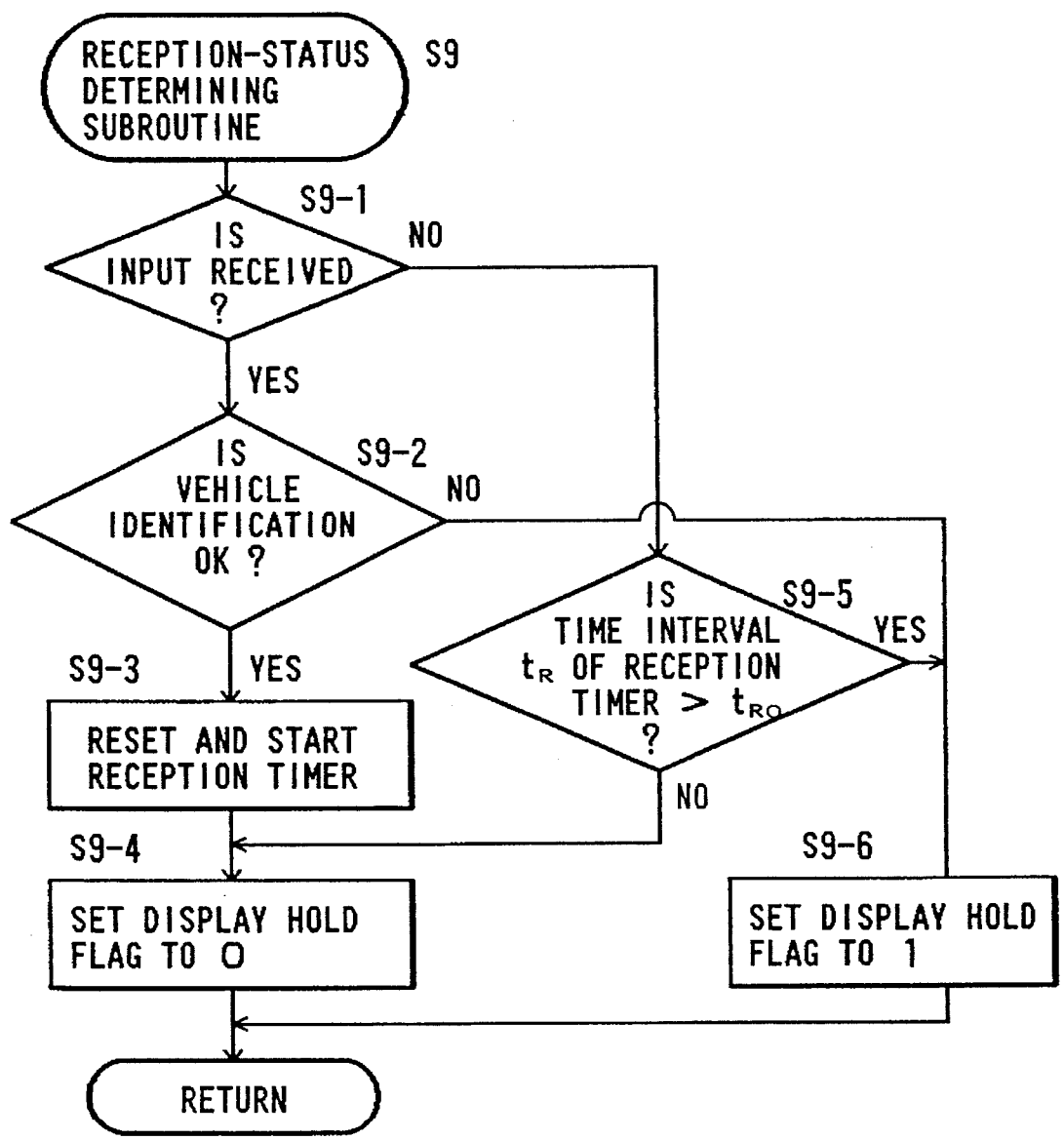
FIG. 17 is a flowchart for describing, in detail, a still further routine used in the sequential routine for displaying the detected information shown in FIG. 6.

A transmission command or instruction subroutine is next executed in Step S8 as illustrated in FIG. 16. That is, the output of the IGN-KEY sensor 76 is first read and it is determined whether or not the key has been inserted into the ignition (Step S8-1). If it is determined that the key is in a non-inserted state, i.e. NO, then the charge-status determining ECU 48 and the charge control ECU 38 make self-diagnoses (Step S8-2). It is then determined whether or not the two ECUs 48 and 38 are normal (Step S8-3). If the answer is determined to be YES, it is then determined whether or not a timer flag of a timer for transmission has been set to "1" (Step S8-4).

If the answer is determined to be YES in Step S8-4, then the timer is in operation. It is therefore determined whether or not an elapsed time interval t of the timer has reached a predetermined transmission time interval $t_O$ (Step S8-5). If the answer is determined to be YES, then the digitized data $\gamma$ referred to above is transmitted (Step S8-6) and the timer is reset (Step S8-7). Further, the timer flag is set to "0" (Step S8-8) and the routine procedure is returned to the main routine.

If the answer is determined to be NO in Step S8-5, then the routine procedure is returned to the main routine. If the answer is determined to be NO in Step S8-4, i.e., if it is determined that the timer is in non-operation, then the timer is energized to start counting (Step S8-9) and the timer flag is set to "1" (Step S8-10). Thereafter, Step S8-5 and Steps subsequent to Step S8-5 are executed.

If it is determined in Step S8-1 that the key has been inserted into the ignition, then the timer is held in a reset state until the key is extracted from the ignition (Step S8-11).

Thereafter, the timer flag is set to "0" (Step S8-12) and the routine procedure is returned to the main routine. In this case, the transmission data is intermittently transmitted in accordance with the transmission time interval $t_O$ set by the transmission timer.

The signals indicative of the charge-status display mode, the control mode and the A/C status, which are set up in accordance with the above-described steps, are transmitted from the electric vehicle 12 to the display card 14 by wireless transmission.

Next, a method of receiving and reading the transmitted signals by the receiver 26 and processing the same with the display card 14 will be described in detail with reference to FIGS. 17 through 21.

A reception-status determining subroutine and a vehicle identification signal determining subroutine are executed in Steps 9 and 10 respectively. That is, it is determined whether or not the receiver 26 has received a signal output transmitted as data (Step S9-1). If the answer is determined to be YES, then a vehicle identification signal of the received data is compared with the vehicle identification signal which has been stored in the display card 14 in advance. (Step S9-2).

If the answer is determined to be YES in Step S9-2, then a timer for reception is reset to an initial state and thereafter started (Step S9-3). Afterwards, a display hold flag is set to "0" to release a display hold (Step S9-4) and the routine procedure is returned to the main routine.

If the answer is determined to be NO in Step S9-1, it is then determined whether or not an elapsed time interval $t_R$ of the reception timer when in operation exceeds a predetermined time-up time interval $t_{RO}$ (Step S9-5). If the answer is determined to be NO, then the display hold flag is set to "0" in Step S9-4.

If the answer is determined to be YES in Step S9-5 or if the answer is determined to be NO in Step S9-2, then the display hold flag is set to "1" (Step S9-6) and the routine procedure is returned to the main routine.

When reception is discontinued and the reception timer has timed out, the display is held or fixed. Even when the reception is being made and the vehicle identification signal does not match the stored vehicle identification signal, the display can be held, thereby making it possible to display a suitable charge status at all times.

Figure 18:
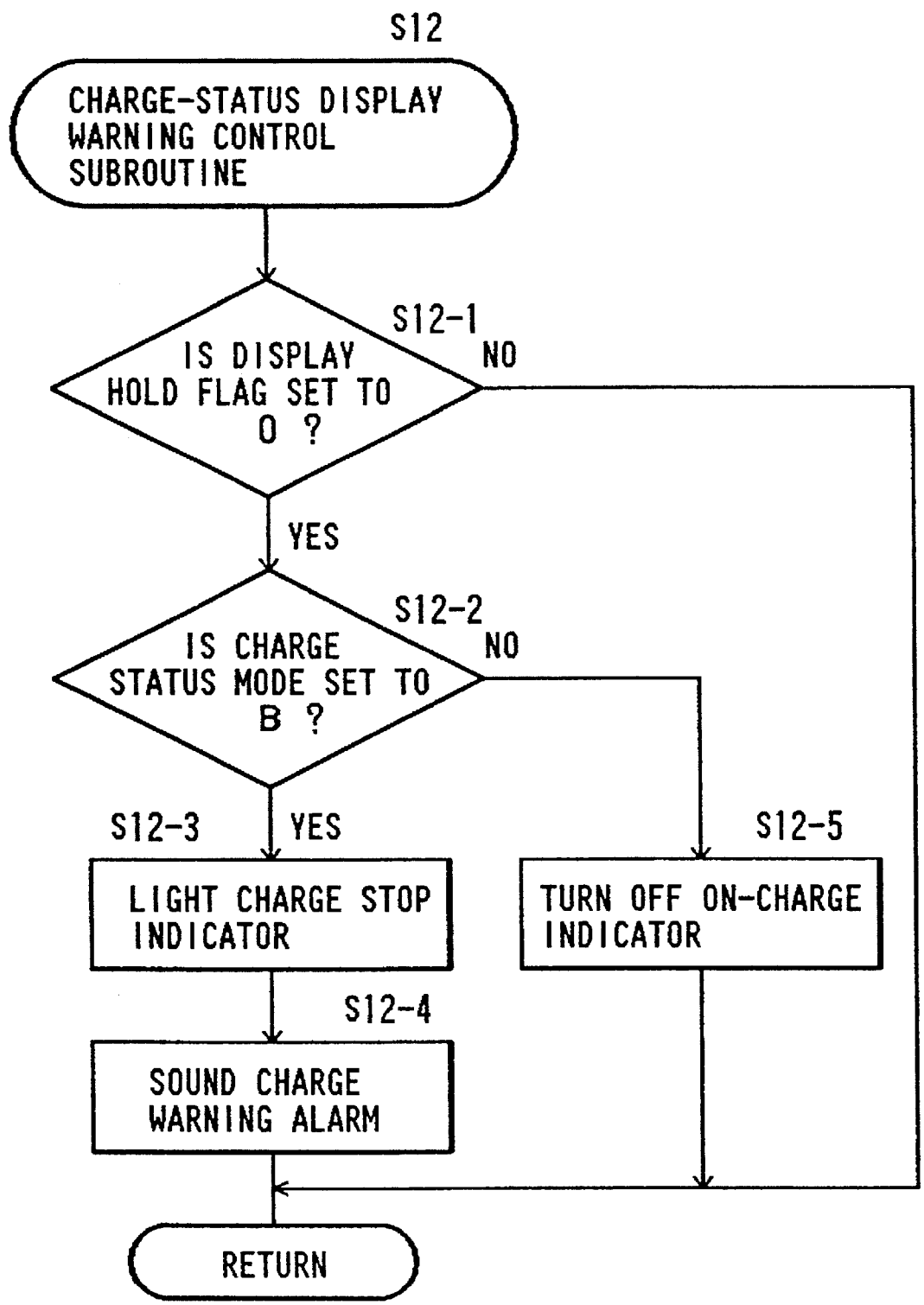
FIG. 18 is a flowchart for describing, in detail, a still further routine used in the sequential routine for displaying the detected information shown in FIG. 6.

A charge-status display warning control subroutine is executed in Step S12 illustrated in FIG. 18 as follows. The display control ECU 100 determines whether or not the display hold flag has been brought to "0" (Step S12-1). If the answer is determined to be YES, it is then determined whether or not a charge status mode is of a charge status mode B for stopping the charging process in the course of the charging (Step S12-2). If the answer is determined to be YES in Step S12-2, then the display control ECU 100 turns off the on-charge indicator 104 and causes the charge stop indicator 106 to blink (Step S12-3). Further, the warning circuit 31 is energized to sound the buzzer 121 (Step S12-4) and the routine procedure is returned to the main routine.

If the answer is determined to be NO in Step S12-2, then the display control ECU 100 causes the on-charge indicator 104 to blink (Step S12-5). Thereafter, the routine procedure is returned to the main routine. If the answer is determined to be NO in Step S12-1, i.e., if the display is held, then the routine procedure is returned to the main routine (see FIG. 18).

Figure 19:
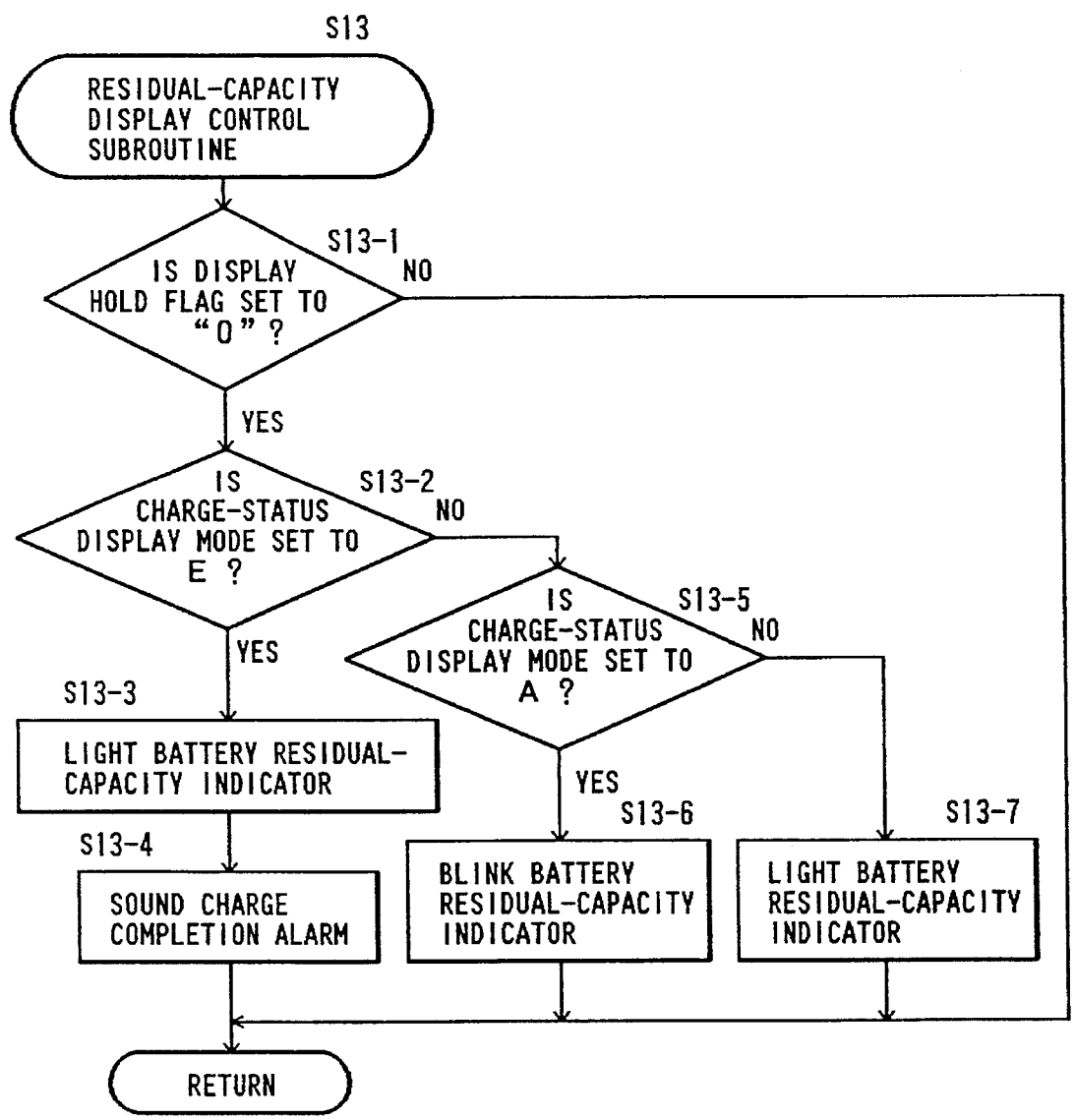
FIG. 19 is a flowchart for describing, in detail, a still further routine used in the sequential routine for displaying the detected information shown in FIG. 6.

Next, a battery residual-capacity display control subroutine to be executed in Step S13 will be described with reference to FIG. 19.

Under the battery residual-capacity display control subroutine, the display control ECU 100 determines whether or not a display hold flag has been set to "0" (Step S13-1). If the answer is determined to be YES, it is then determined that the remaining capacity DOD has been displayed. It is then judged whether or not the charge-status display mode has been brought to E (Step S13-2). If the answer is determined to be YES in Step S13-2, it is then determined that a charging process has been completed. At this time, the residual capacity DOD is displayed on the residual-capacity indicator 102 (Step S13-3). Then, the warning circuit 31 is energized to sound the buzzer for informing an operator of the completion of battery charging (Step S13-4) and the routine procedure is returned to the main routine.

If the answer is determined to be NO in Step S13-2, it is then determined whether or not the charge-status display mode has been set to A (Step S13-5). If the answer is determined to be YES in Step S13-5, it is then determined that the battery charging is normally in progress. The residual-capacity indicator 102 for indicating the residual capacity DOD at this time is caused to blink (Step S13-6) and the routine procedure is returned to the main routine. If the answer is determined to be NO in Step S13-5, the residual-capacity indicator 102 for indicating the remaining capacity of the main battery 18 is lighted up (Step S13-7) and the routine procedure is returned to the main routine. If the answer is determined to be NO in Step S13-1, it is then determined that the residual capacity DOD has not been displayed. Hence, the routine procedure is returned to the main routine.

Figure 20:
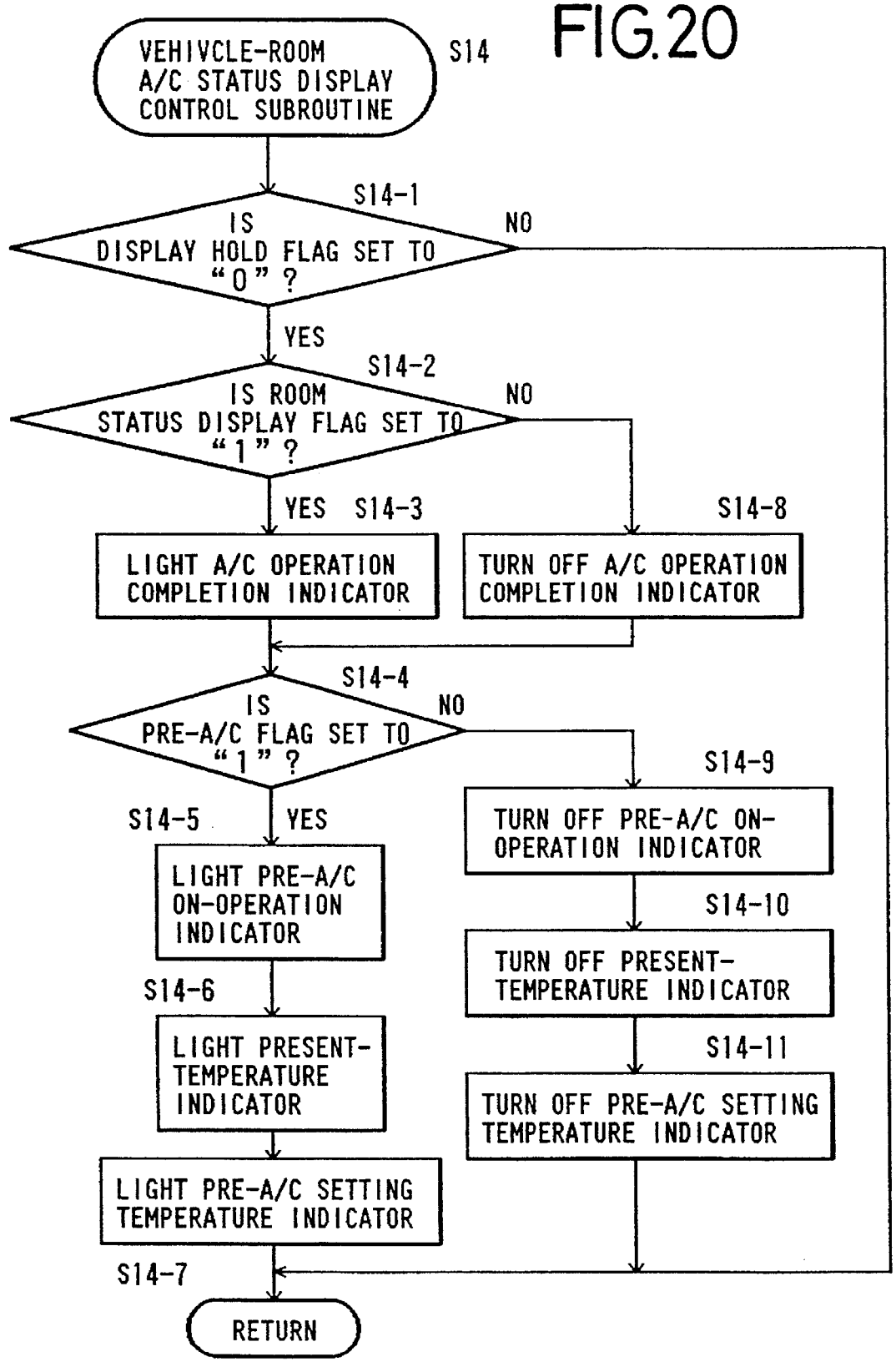
FIG. 20 is a flowchart for describing, in detail, a still further routine used in the sequential routine for displaying the detected information shown in FIG. 6.

An interior or room status display control subroutine to be executed in Step S14 will next be described with reference to FIG. 20.

The display control ECU 100 determines whether or not a display hold flag has been set to "0" (Step S14-1). If the answer is determined to be YES, it is then determined whether or not a room status display flag has been set to "1" (Step S14-2). If the answer is determined to be YES in Step S14-2, it is then judged that the room status has been displayed and the pre-A/C operation completion indicator 118 is lighted (Step S14-3). It is then determined whether or not a pre-A/C flag has been set to "1" (Step S14-4). If the answer is determined to be YES in Step S14-4, then the pre-A/C on-operation indicator 116 is lighted up (Step S14-5).

Next, the present temperature of the vehicle room is indicated on the room present-temperature indicator 114 (Step S14-6) and the temperature of the pre-A/C is displayed on the pre-A/C setting temperature indicator 112 (Step S14-7). Thereafter, the routine procedure is returned to the main routine.

If the answer is determined to be NO in Step S14-2, then the display control ECU 100 turns off the pre-A/C operation completion indicator 118 (Step S14-8) and executes the Step S14-4 in which the pre-A/C flag determining routine is executed and the steps subsequent to Step S14-4.

If the answer is determined to be NO in Step S14-4, then the display control ECU 100 turns off the pre-A/C on-operation indicator 116 (Step S14-9). Further, the display control ECU 100 turns off the room present-temperature indicator 114 (Step S14-10) and the pre-A/C setting temperature indicator 112 (Step S14-11). Thereafter, the routine procedure is returned to the main routine.

Further, if the answer is determined to be NO in Step S14-1, then the routine procedure is returned to the main routine.

Figure 21:
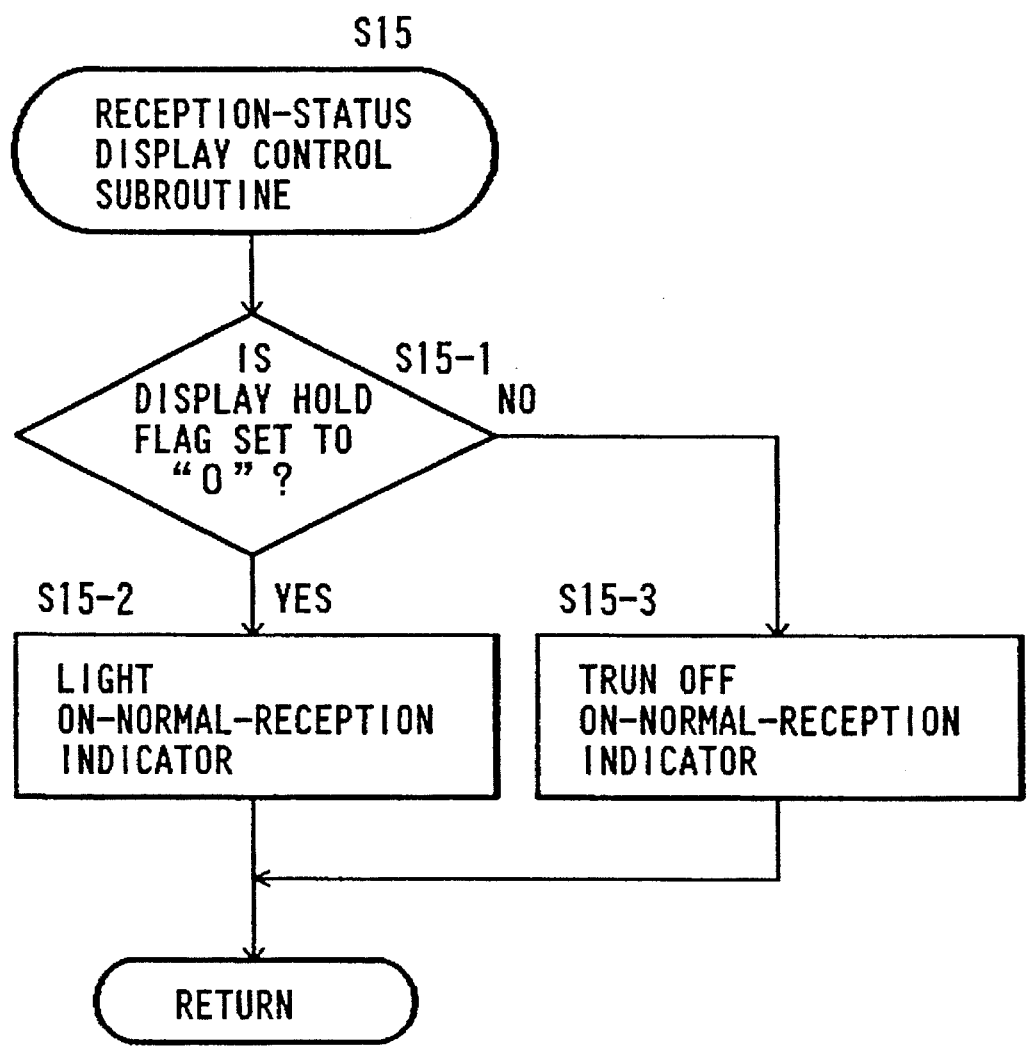
FIG. 21 is a flowchart for describing, in detail, a still further routine used in the sequential routine for displaying the detected information shown in FIG. 6.

A reception-status display control subroutine will next be described with reference to FIG. 21.

The reception-status display control subroutine is executed in the following manner. That is, the display control ECU 100 determines whether or not a display hold flag has been set to "0" (Step S15-1). If the answer is determined to be YES in Step S15-1, then the on-normal-reception indicator 110 is lighted (Step S15-2) and the routine procedure is returned to the main routine. If the answer is determined to be NO in Step S15-1, it has then been determined that one or more of the ECUs has been damaged or impaired or the receiver 26 cannot normally receive the desired data because the wireless transmitter 24 and the receiver 26 are spaced more than a communicable distance away from each other. Hence, the on-normal-reception indicator 110 is turned off (Step S15-3) and the routine procedure is returned to the main routine.

According to the present embodiment, as has been described above, the transmission signals indicative of both the residual capacity of the main battery 18 and the charge-status display mode, which have been detected by the detection circuit 20 of the electric vehicle 12, and the transmission signal for specifying the vehicle are set up in code form, thereby making it possible to make these transmission signals very compact. The compacted code is transmitted by wireless transmitter 24. Then, the transmitted code is received by the receiver 26 and displayed on the display circuit 30 under the control of the display control circuit 28. Therefore, the charging operator can monitor the status of charging and the state of the vehicle while the main battery 18 is being charged at a location spaced from the electric vehicle 12. The display card 14 can be returned to the electric vehicle 12 and terminal 34 can be plugged into power transmission terminal 25 for periodically recharging the independent battery 32 of the display card 14. During such recharging of independent battery 32, the operator can refer to the display card 14 for determining the status of the charging of the main battery 18.

According to the charge-status display system of the present invention, which is suitable for use with the electric vehicle, information indicative of the state of the charging of the electric vehicle can be obtained at a location remote from the electric vehicle. Thus, the charging operator is no longer required to remain with the vehicle over the long period of time that the main battery is being charged.

Having now fully described the invention, it will be apparent to those skilled in the art that many changes and modifications can be made without departing from the spirit or scope of the invention as set forth herein.

What is claimed is:

1. A charge-status display system for use with an electric vehicle for transmitting via wireless transmission from the electrical vehicle information indicative of a status of charge of a main battery used as a running drive source of the electric vehicle and receiving and displaying the information at a location remote from the electric vehicle, said system comprising:

an external AC power supply source for recharging said main battery;

a charge-status detection unit disposed in the electric vehicle, said detection unit comprising,
means for detachably connecting said main battery to said power supply source, said main battery being connected to said power supply source during charging of said main battery and disconnected from said power supply source while said main battery is under use as said running drive source of the electric vehicle, a plurality of detecting means for detecting a plurality of operating conditions of said main battery during charging, determining means for repeatedly determining a present status of charging of said main battery based on the plurality of operating conditions detected by said plurality of detecting means and outputting signals representing said present status of charging, and wireless transmitting means disposed in the electric vehicle for digitally coding said signals and for transmitting said signals via wireless transmission during battery charging from said detection unit; and a portable display unit removable from the electric vehicle to a location remote from the electric vehicle, said display unit comprising, power supply means independent of said main battery for supplying power to said display unit, receiving means for receiving therein said signals transmitting by said wireless transmitting means, and display means for displaying thereon said present status of charging of said main battery based on the plurality of operating conditions detected by said plurality of detecting means and said signals received by said receiving means.

2. A charge-status display system according to claim 1, wherein said detecting means includes voltage detecting means for detecting a charging voltage of said main battery, said determining means includes voltage determining means for determining whether said charging voltage falls within a predetermined range.

3. A charge-status display system according to claim 1, wherein said detecting means includes current detecting means for detecting a charging current of said main battery, said determining means includes current determining means for determining whether said charging current falls within a predetermined range.

4. A charge-status display system according to claim 1, wherein said detecting means includes temperature detecting means for detecting the temperature of said main battery, said determining means includes temperature determining means for determining whether the temperature of said main battery is more than a first predetermined value and less than a second predetermined value, and said display unit includes displaying means for displaying thereon information indicating a charge-stop state when it is determined that the temperature of said main battery is more than said second predetermined value and for displaying thereon information indicating an on-charge state when it is determined that the temperature of said main battery is less than said second predetermined value.

5. A charge-status display system according to claim 1, wherein said determining means includes self-diagnosing means.

6. A charge-status display system according to claim 1, wherein said determining means determines whether the charging of said main battery is being effected, stopped and completed and said display means effects different displays for each said determination.

7. A charge-status display system according to claim 1, wherein said wireless transmitting means includes storing means for storing vehicle-specifying information therein in advance and controlling means for reading the vehicle-specifying information stored in said storing means and transmitting said read vehicle-specifying information together with transmission information including charge-status information and battery residual-capacity information.

8. A charge-status display system for use with an electric vehicle for transmitting via wireless transmission from the electric vehicle information indicative of a status of charging of a main battery used as a running drive source of the electric vehicle and receiving and displaying the information at a location remote from the electric vehicle, said system comprising:

a charge-status detection unit disposed in the electric vehicle, said detection unit comprising,
  a plurality of detecting means for detecting a plurality of operating conditions of said main battery during charging,
  determining means for repeatedly determining a present status of charging of said main battery based on the plurality of operating conditions detected by said plurality of detecting means and outputting signals representing said present status of charging, and
  wireless transmitting means disposed in said electric vehicle for digitally coding said signals and for transmitting said signals via wireless transmission during battery charging from said detection unit; and
a display unit separated from said electric vehicle and disposed at a location remote from said electric vehicle, said display unit comprising,
  power supply means independent of said main battery for supply power to said display unit,
  receiving means for receiving therein said signals transmitting by said wireless transmitting means, and
  display means for displaying thereon said present status of charging of said main battery based on the plurality of operating conditions detected by said plurality of detecting means and said signals received by said receiving means,
wherein said detecting means includes a rotation sensor for detecting the rotation of at least one wheel of the electric vehicle.

9. A charge-status display system, for use with an electric vehicle for transmitting via wireless transmission from the electrical vehicle information indicative of a status of charge of a main battery used as a running drive source of the electric vehicle and receiving and displaying the information at a location remote from the electric vehicle, said system comprising:

an external AC power supply source for recharging said main battery;
a charge-status detection unit disposed in the electric vehicle, said detection unit comprising,
  means for detachably connecting said main battery to said power supply source, said main battery being connected to said power supply source during charging of said main battery and disconnected from said power supply source while said main battery is under use as said running drive source of the electric vehicle,
  a plurality of detecting means for detecting a plurality of operating conditions of said main battery during charging,
  determining means for repeatedly determining a present status of charging of said main battery based on the plurality of operating conditions detected by said plurality of detecting means and outputting signals representing said present status of charging, and
  wireless transmitting means disposed in the electric vehicle for digitally coding said signals and for transmitting said signals via wireless transmission during battery charging from said detection unit; and
a display unit separated from the electric vehicle and disposed at a location remote from the electric vehicle, said display unit comprising,
  power supply means independent of said main battery for supplying power to said display unit,
  receiving means for receiving therein said signals transmitting by said wireless transmitting means, and
  display means for displaying thereon said present status of charging of said main battery based on the plurality of operating conditions detected by said plurality of detecting means and said signals received by said receiving means,
wherein said detecting means includes leakage detecting means for detecting undesired flow of electricity through a running-drive electric system and a control electric system, said determining means includes leakage determining means for determining whether the amount of said undesired flow of electricity falls within a predetermined range.

10. A charge-status display system for use with an electric vehicle for transmitting via wireless transmission from the electrical vehicle information indicative of a status of charge of a main battery used as a running drive source of the electric vehicle and receiving and displaying the information at a location remote from the electric vehicle, said system comprising:

an external AC power supply source for recharging said main battery;
a charge-status detection unit disposed in the electric vehicle, said detection unit comprising,
  means for detachably connecting said main battery to said power supply source, said main battery being connected to said power supply source during charging of said main battery and disconnected from said power supply source while said main battery is under use as said running drive source of the electric vehicle,
  a plurality of detecting means for detecting a plurality of operating conditions of said main battery during charging,
  determining means for repeatedly determining a present status of charging of said main battery based on the plurality of operating conditions detected by said plurality of detecting means and outputting signals representing said present status of charging, and
  wireless transmitting means disposed in the electric vehicle for digitally coding said signals and for transmitting said signals via wireless transmission during battery charging from said detection unit; and
a display unit separated from the electric vehicle and disposed at a location remote from the electric vehicle, said display unit comprising,
  power supply means independent of said main battery for supplying power to said display unit,
  receiving means for receiving therein said signals transmitting by said wireless transmitting means, and
  display means for displaying thereon said present status of charging of said main battery based on the plurality of operating conditions detected by said plurality of detecting means and said signals received by said receiving means, wherein said detecting means includes connection detecting means for detecting the state of connection or non-connection between a power drive unit and said main battery.

11. A charge-status display system for use with an electric vehicle for transmitting via wireless transmission from the electric vehicle information indicative of a status of charging of a main battery used as a running drive source of the electric vehicle and receiving and displaying the information at a location remote from the electric vehicle, said system comprising:

a charge-status detection unit disposed in the electric vehicle, said detection unit comprising,
a plurality of detecting means for detecting a plurality of operating conditions of said main battery during charging,
determining means for repeatedly determining a present status of charging of said main battery based on the plurality of operating conditions detected by said plurality of detecting means and outputting signals representing said present status of charging, and
wireless transmitting means disposed in said electric vehicle for digitally coding said signals and for transmitting said signals via wireless transmission during battery charging from said detection unit; and a display unit separated from said electric vehicle and disposed at a location remote from said electric vehicle, said display unit comprising,
power supply means independent of said main battery for supply power to said display unit,
receiving means for receiving therein said signals transmitting by said wireless transmitting means, and
display means for displaying thereon said present status of charging of said main battery based on the plurality of operating conditions detected by said plurality of detecting means and said signals received by said receiving means, wherein said detecting means includes hydrogen-gas concentration detecting means for detecting the concentration of hydrogen gas in a box for accommodating said main battery therein, said determining means includes hydrogen-gas concentration determining means for determining whether the concentration of the hydrogen gas is more than a first predetermined value and less than a second predetermined value, and said display unit includes display means for displaying information indicative of a power-reception stop state thereon when it is determined that the concentration of the hydrogen gas is more than said second predetermined value and for displaying information indicative of charging state when it is determined that the concentration of the hydrogen gas is less than said second predetermined value.

12. A charge-status display system for use with an electric vehicle for transmitting via wireless transmission from the electric vehicle information indicative of a status of charging of a main battery used as a running drive source of the electric vehicle and receiving and displaying the information at a location remote from the electric vehicle, said system comprising:

a charge-status detection unit disposed in the electric vehicle, said detection unit comprising,
a plurality of detecting means for detecting a plurality of operating conditions of said main battery during charging,
determining means for repeatedly determining a present status of charging of said main battery based on the plurality of operating conditions detected by said plurality of detecting means and outputting signals representing said present status of charging, and
wireless transmitting means disposed in said electric vehicle for digitally coding said signals and for transmitting said signals via wireless transmission during battery charging from said detection unit; and a display unit separated from said electric vehicle and disposed at a location remote from said electric vehicle, said display unit comprising,
power supply means independent of said main battery for supply power to said display unit,
receiving means for receiving therein said signals transmitting by said wireless transmitting means, and
display means for displaying thereon said present status of charging of said main battery based on the plurality of operating conditions detected by said plurality of detecting means and said signals received by said receiving means, wherein said transmitting means has a timer for intermittently transmitting information.

13. A charge-status display system for use with an electric vehicle for transmitting via wireless transmission from the electric vehicle information indicative of a status of charging of a main battery used as a running drive source of the electric vehicle and receiving and displaying the information at a location remote from the electric vehicle, said system comprising:

a charge-status detection unit disposed in the electric vehicle, said detection unit comprising,
a plurality of detecting means for detecting a plurality of operating conditions of said main battery during charging,
determining means for repeatedly determining a present status of charging of said main battery based on the plurality of operating conditions detected by said plurality of detecting means and outputting signals representing said present status of charging, and
wireless transmitting means disposed in said electric vehicle for digitally coding said signals and for transmitting said signals via wireless transmission during battery charging from said detection unit; and a display unit separated from said electric vehicle and disposed at a location remote from said electric vehicle, said display unit comprising,
power supply means independent of said main battery for supply power to said display unit,
receiving means for receiving therein said signals transmitting by said wireless transmitting means, and
display means for displaying thereon said present status of charging of said main battery based on the plurality of operating conditions detected by said plurality of detecting means and said signals received by said receiving means, wherein said wireless transmitting means includes converting means for converting data about the status of charging of said main battery and data about the remaining capacity of said main battery into digital form and coding means for setting up new transmission data obtained by combining said digitized charge-status data and said digitized battery residual-capacity data together in code form so as to be represented in compact form, and said receiving means includes decoding means for decoding said coded transmission data in accordance with predetermined stored decoding codes.

14. A charge-status display system for use with an electric vehicle for transmitting via wireless transmission from the electric vehicle information indicative of a status of charging of a main battery used as a running drive source of the electric vehicle and receiving and displaying the information at a location remote from the electric vehicle, said system comprising:

a charge-status detection unit disposed in the electric vehicle, said detection unit comprising,
  a plurality of detecting means for detecting a plurality of operating conditions of said main battery during charging,
  determining means for repeatedly determining a present status of charging of said main battery based on the plurality of operating conditions detected by said plurality of detecting means and outputting signals representing said present status of charging, and
  wireless transmitting means disposed in said electric vehicle for digitally coding said signals and for transmitting said signals via wireless transmission during battery charging from said detection unit; and a display unit separated from said electric vehicle and disposed at a location remote from said electric vehicle, said display unit comprising,
  power supply means independent of said main battery for supply power to said display unit,
  receiving means for receiving therein said signals transmitting by said wireless transmitting means, and
  display means for displaying thereon said present status of charging of said main battery based on the plurality of operating conditions detected by said plurality of detecting means and said signals received by said receiving means, wherein said receiving means includes display continuation signal generating means for producing a display continuation signal used to continue the present display unless new information is received within a predetermined period of time.

15. A charge-status display system for use with an electric vehicle for transmitting via wireless transmission from the electric vehicle information indicative of a status of charging of a main battery used as a running drive source of the electric vehicle and receiving and displaying the information at a location remote from the electric vehicle, said system comprising:

a charge-status detection unit disposed in the electric vehicle, said detection unit comprising,
  a plurality of detecting means for detecting a plurality of operating conditions of said main battery during charging,
  determining means for repeatedly determining a present status of charging of said main battery based on the plurality of operating conditions detected by said plurality of detecting means and outputting signals representing said present status of charging, and
  wireless transmitting means disposed in said electric vehicle for digitally coding said signals and for transmitting said signals via wireless transmission during battery charging from said detection unit; and a display unit separated from said electric vehicle and disposed at a location remote from said electric vehicle, said display unit comprising,
  power supply means independent of said main battery for supply power to said display unit,
  receiving means for receiving therein said signals transmitting by said wireless transmitting means, and
  display means for displaying thereon said present status of charging of said main battery based on the plurality of operating conditions detected by said plurality of detecting means and said signals received by said receiving means, wherein said electric vehicle has a power transmission terminal for charging said display unit, and said display unit has a power reception terminal for electrically connecting with said power transmission terminal, said display unit being charged with the charging of the electric vehicle by electrically connecting said power reception terminal and said power transmission terminal to each other.

16. A charge-status detecting device for use with an electric vehicle comprising:

a plurality of detecting means for detecting respective operating conditions of a main battery used as a running drive source of the electric vehicle during charging of said main battery;

means for detachably connecting said main battery to an external AC power supply source, said main battery being connected to said power supply source during charging of said main battery and disconnected from said power supply source while said main battery is under use as said running drive source of the electric vehicle;

determining means for repeatedly determining a present status of charging of said main battery based on operating conditions detected by said plurality of detecting means and outputting signals representing said present status of charging;

wireless transmitting means disposed in the electric vehicle for digitally coding said signals and for transmitting said signals via wireless transmission to a portable receiving means removable from the electric vehicle to a location remote from the electric vehicle, said receiving means being powered by a power supply means independent of said main battery.

17. A charge-status detecting device for use with an electric vehicle comprising:

a plurality of detecting means for detecting a plurality of operating conditions of a main battery used as a running drive source of the electric vehicle;

means for detachably connecting said main battery to an external AC power supply source, said main battery being connected to said power supply source during charging of said main battery and disconnected from said power supply source while said main battery is under use as said running drive source of the electric vehicle;

determining means for repeatedly determining a present status of charging of said main battery based on plurality of operating conditions detected by said plurality of detecting means and outputting signals representing said present status of charging;

wireless transmitting means disposed in the electric vehicle for digitally coding said signals and for transmitting said signals via wireless transmission;

portable receiving means removable from the electric vehicle to a location remote from the electric vehicle for receiving said signals and displaying said present status of charging said main battery based on the plurality of detecting means; and power supply means independent of said main battery for supplying power to said receiving means at a location remote from the electric vehicle.

18. A charge-status display device for use with an electric vehicle comprising:

means for detecting and determining a present charging status of a main battery of the electric vehicle and transmitting via wireless transmission said present charging status;

means for detachably connecting said main battery to an external AC power supply source, said main battery being connected to said power supply source during charging of said main battery and disconnected from said power supply source while said main battery is under use as a running drive source of the electric vehicle;

portable receiving means removable from the electric vehicle to a location remote from the electric vehicle for receiving said present charging status transmitted from said detecting and determining means;

display means for displaying said present charging status received by said receiving means; and power supply means independent of said main battery for supplying power to said receiving means and said display means at a location remote from the electric vehicle.

* * * * *